(12) United States Patent
Scullin et al.

(10) Patent No.: US 12,136,542 B2
(45) Date of Patent: Nov. 5, 2024

(54) APPARATUS FOR ION ENERGY ANALYSIS OF PLASMA PROCESSES

(71) Applicant: Impedans Ltd, Northern Cross (IE)

(72) Inventors: Paul Scullin, Lucan County (IE); James Doyle, Enniscorthy County (IE); J J Lennon, Ballymun (IE); David Gahan, Terenure (IE); Tigran Poghosyan, San Jose, CA (US)

(73) Assignee: IMPEDANS LTD, Dublin (IE)

( * ) Notice: Subject to any disclaimer, the term of this patent is extended or adjusted under 35 U.S.C. 154(b) by 328 days.

(21) Appl. No.: 17/589,039

(22) Filed: Jan. 31, 2022

(65) Prior Publication Data

US 2022/0157581 A1 May 19, 2022

Related U.S. Application Data

(63) Continuation of application No. 17/467,379, filed on Sep. 6, 2021, now Pat. No. 11,908,668.

(30) Foreign Application Priority Data

Sep. 10, 2020 (EP) .................................... 20195445

(51) Int. Cl.
*H01J 37/32* (2006.01)
*H01L 21/3065* (2006.01)

(52) U.S. Cl.
CPC .. *H01J 37/32935* (2013.01); *H01J 37/32422* (2013.01); *H01L 21/3065* (2013.01); *H01J 2237/24485* (2013.01)

(58) Field of Classification Search
CPC ........... H01J 37/32935; H01J 37/32422; H01J 2237/24485; H01J 49/488; H01J 37/32917; H01L 21/3065; G01T 1/366
See application file for complete search history.

(56) References Cited

U.S. PATENT DOCUMENTS 3,062,442 A * 11/1962 Boensel .................. H03M 1/00
341/158
4,391,237 A * 7/1983 Abe ...................... F02P 19/022
123/145 A (Continued)

FOREIGN PATENT DOCUMENTS

CN          1331614 A  *  1/2002  ............. B01D 53/32
EP          0517166 A1    12/1992

(Continued)

OTHER PUBLICATIONS

Wikipedia contributors. (Jun. 25, 2020). H-bridge. In Wikipedia, The Free Encyclopedia. Retrieved 22:02, Feb. 9, 2024, from https://en.wikipedia.org/w/index.php?title=H-bridge&oldid=964478181 (Year: 2020).*

(Continued)

*Primary Examiner* — David E Smith
*Assistant Examiner* — Christopher J Gassen
(74) *Attorney, Agent, or Firm* — J. Fish Law, PLLC

(57) ABSTRACT

An apparatus for obtaining ion energy distribution, IED, measurements in a plasma processing system, in one example, comprising a substrate for placement in the plasma processing system and exposed to the plasma, an ion energy analyser disposed in the substrate for measuring the ion energy distribution at the substrate surface during plasma processing, the analyser comprising a first conductive grid, a second conductive grid, a third conductive grid, a fourth conductive grid and a collection electrode, each grid separated by an insulation layer, a battery power supply and control circuitry, integrated in the substrate, for supplying and controlling voltage to each of the grids and the collector of the ion energy analyser; and a high voltage generating circuit.

30 Claims, 12 Drawing Sheets

(56) References Cited

U.S. PATENT DOCUMENTS

| | | | |
|---|---|---|---|
| 5,431,684 A * | 7/1995 | Archer | A61N 1/3931 |
| | | | 607/5 |
| 5,451,784 A | 9/1995 | Loewenhardt et al. | |
| 5,565,681 A | 10/1996 | Loewenhardt et al. | |
| 5,715,155 A * | 2/1998 | Shahani | H02M 7/538 |
| | | | 363/17 |
| 5,969,639 A | 10/1999 | Lauf et al. | |
| 6,326,794 B1 | 12/2001 | Lundquist et al. | |
| 6,830,650 B2 | 12/2004 | Roche et al. | |
| 7,151,366 B2 | 12/2006 | Renken et al. | |
| 7,875,859 B2 | 1/2011 | Chen et al. | |
| 7,960,670 B2 | 6/2011 | Mundt et al. | |
| 8,737,093 B1 * | 5/2014 | Baker | H02M 3/156 |
| | | | 323/225 |
| 8,816,281 B2 | 8/2014 | Funk et al. | |
| 10,124,083 B2 * | 11/2018 | Robert | A61L 9/22 |
| 2005/0034812 A1 | 2/2005 | Roche et al. | |
| 2005/0115673 A1 | 6/2005 | Samukawa et al. | |
| 2006/0087793 A1 * | 4/2006 | Kim | H01J 37/321 |
| | | | 361/234 |
| 2007/0047275 A1 * | 3/2007 | Hesterman | H02M 3/335 |
| | | | 363/95 |
| 2008/0026488 A1 | 1/2008 | Panda et al. | |
| 2009/0242790 A1 | 10/2009 | Chen et al. | |
| 2011/0174777 A1 | 7/2011 | Jensen et al. | |
| 2012/0248322 A1 | 10/2012 | Funk et al. | |
| 2013/0228550 A1 | 9/2013 | Mori et al. | |
| 2014/0062495 A1 * | 3/2014 | Carter | G01N 27/06 |
| | | | 324/459 |
| 2017/0256463 A1 | 9/2017 | Bailey, III et al. | |
| 2019/0049937 A1 | 2/2019 | Tetiker et al. | |

FOREIGN PATENT DOCUMENTS

| | | | | |
|---|---|---|---|---|
| EP | 1278294 A1 * | 1/2003 | | H02M 3/28 |
| JP | 2002176036 A * | 6/2002 | | H01J 37/32623 |
| JP | 2008047564 A * | 2/2008 | | G02F 1/1303 |
| WO | 2005017937 A2 | 2/2005 | | |

OTHER PUBLICATIONS

Kawamura et al, Ion Energy Distributions in RF Sheaths; Review, Analysis and Simulation, Plasma Sources Sci. Technol. 8 (1999) R45-R64, United Kingdom.

Gahan et al, Retarding Field Analyzer for Ion Energy Distribution Measurements at a Radio-Frequency Biased Electrode, Review of Scientific Instruments 79, 033502 (2008), pp. 10.

Talley et al., IEDF Distortion and Resolution Considerations for RFEA Operation at High Voltages, Plasma Sources Sci. Technol. 26, 125001 (2017), pp. 10.

Sharma et al., A spatially resolved retarding field energy analyzer design suitable for uniformity analysis across the surface of a semiconductor wafer, Review of Scientific Instruments 85, 043509 (2014), pp. 6.

Sharma et al., Measurement of deposition rate and ion energy distribution in a pulsed dc magnetron sputtering system using a retarding field analyzer with embedded quartz crystal microbalance, Review of Scientific Instruments 87, 043511 (2016), pp. 10.

Search Opinion and Report, EP Application No. 20195445, dated Mar. 12, 2021, pp. 11.

Search Opinion and Report, EP Application No. 21193805, dated Feb. 9, 2022, pp. 7.

Search Opinion and Report, EP Application No. 21205450, dated Feb. 17, 2022, pp. 11.

* cited by examiner

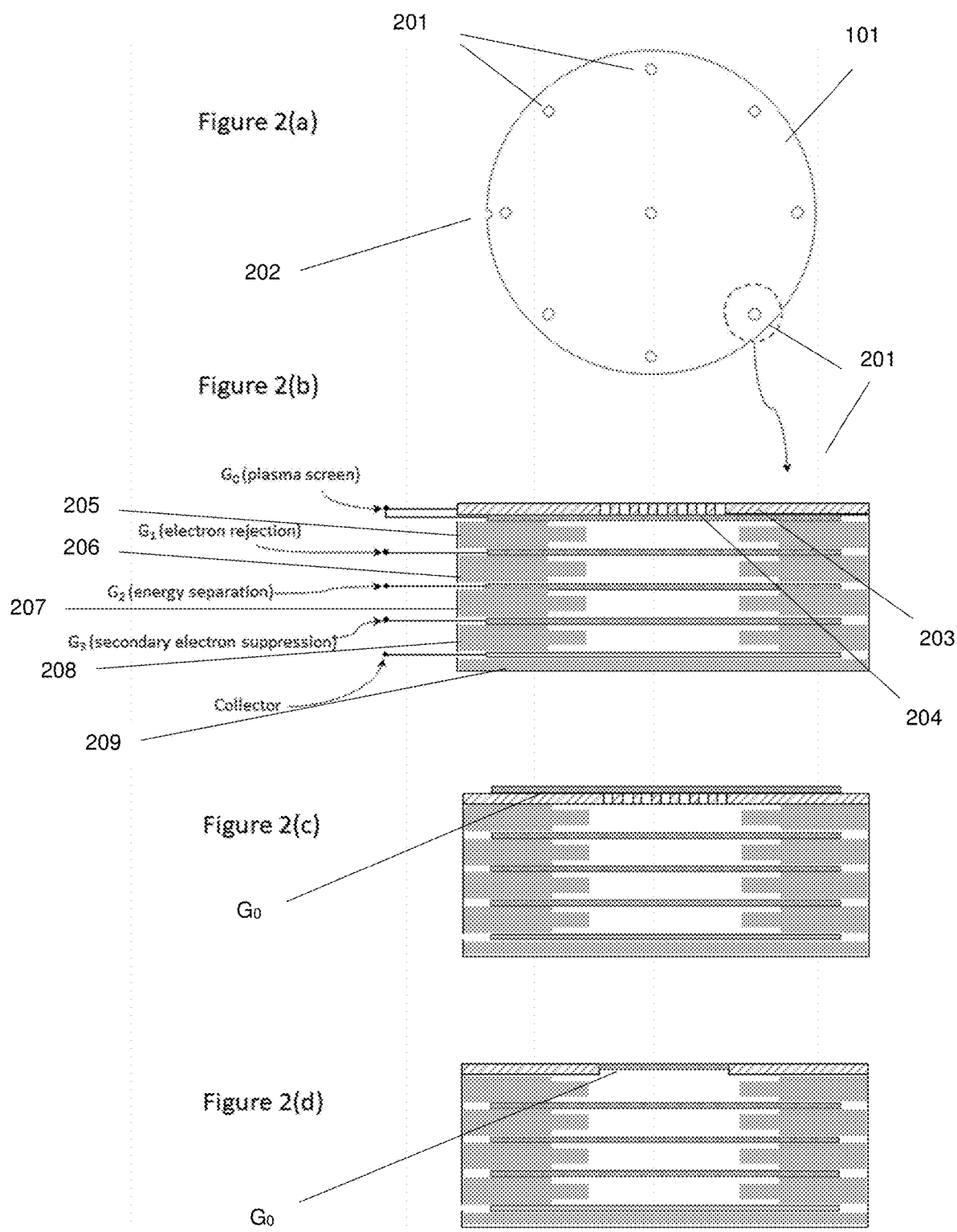

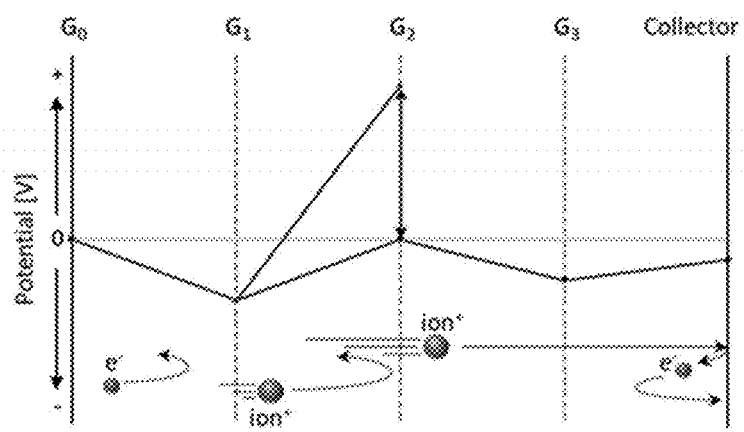

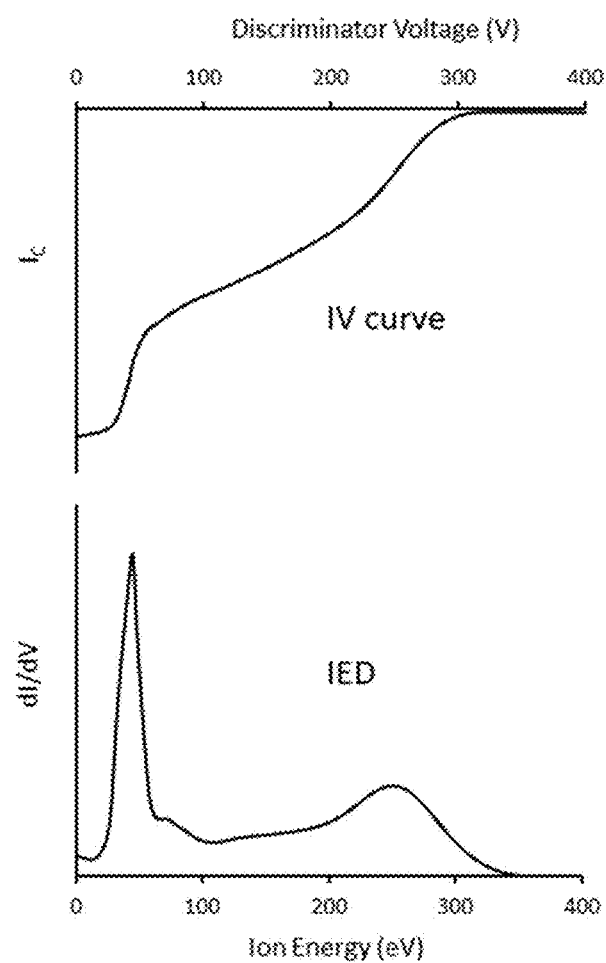

APPARATUS FOR ION ENERGY ANALYSIS OF PLASMA PROCESSES

CROSS-REFERENCE TO RELATED APPLICATIONS

This application is a continuation of U.S. patent application Ser. No. 17/467,379 filed Sep. 6, 2021. U.S. patent application Ser. No. 17/467,379 claims priority to European Patent Application No. EP20195445.0, filed Sep. 10, 2020, each of which are incorporated by reference in their entirety.

FIELD

The present application relates to an apparatus and method for measuring the incident charged particle current densities and energy distributions arriving at a substrate or surface during plasma processing.

BACKGROUND OF THE INVENTION

Plasma processing is used extensively in modern industry for a wide range of applications. A well-known example is the manufacture of integrated circuits in the semiconductor industry. Plasma processing is also used in the production of solar panels, flat panel displays, thin film coatings and medical devices, among many others.

The current density (ion flux) and energy distribution of the ions arriving at the substrate surface strongly influence the performance of plasma based processes. In semiconductor manufacturing the substrate is a silicon wafer while in other industries the substrate may be glass panel or a variety of alternatives. Wafer and substrate may be used interchangeably through the document but understood to mean any type of substrate to be used in a plasma process. Throughout the process the substrate surface is bombarded by plasma species, including energetic ions, to remove (etch) and/or deposit layers of material to form structures or features on the workpiece surface. Ion impact may drive the etching and deposition directly, or may be used to activate the surface for more reactive plasma species to do the work. For example, in the plasma etching of features in the semiconductor industry the ion flux and associated (IED) determines important parameters such as etch rate, etch selectivity and etch anisotropy. The IED is therefore a critical plasma parameter to measure, understand and control to ensure optimum process performance.

As the scale-down of transistor critical dimensions continues, tighter control of the IED at the wafer surface is required. Repeatability and uniformity of the IED is critical for optimal process yield. Wafer and substrate integrated IED sensors are therefore essential to the advancement of nanotechnology manufactured using plasma processing.

A variety of ion energy analysers have been developed over many decades to measure the IED in plasma processes. The planar, retarding field analyzer (RFA) design is well known. In many RFA embodiments, a stack of conductive grids, individually separated by insulators, is used to separate ions based on their energy and hence determine the IED. An aperture facing the plasma allows a sample of ions into the device for analysis. A succession of grids are used to a) prevent plasma penetration inside the device, b) repel plasma electrons, c) discriminate ions based on their energies and d) prevent secondary electron emission from the collector electrode. The collector electrode terminates the stack and is used to detect the ion current signal for measurement. The ion current is recorded for each retarding voltage applied to the ion energy discrimination grid to give an integral form of the energy distribution. The tabulated ion current versus discriminator grid voltage data is numerically differentiated to determine the IED.

The IED has been measured extensively, across different plasma tool platforms, with varying degrees of success. The evolution of ion energy analyzer technology has enabled IED measurements in a growing range of applications and over a wider parameter space. Particularly, radio-frequency (RF) filtering techniques that enable deployment of the ion energy analyzer on RF biased substrate pedestals (commonly used in semiconductor manufacturing) has dramatically increased the demand for these devices. Kawamura et al (Plasma Sources Sci. Technol. 8 (1999) R45-R64) give a comprehensive review of the advancement of IED measurements and retarding field analyzer technology for use in processing plasmas up to 1999. Gahan et al (Rev. Sci. Instrum. 79, 033502 (2008)) invented a wired RFA, based on the best known methods, compatible with RF biasing over a wide frequency range in 2008. The sensor stack was built into aluminium dummy wafers, 5 mm thick, with various diameter options. The sensor consisted of three active grids; one to prevent plasma penetration, one to repel plasma electrons and one to discriminate between ion energies. Later revisions of their design incorporated a fourth grid for secondary electron suppression. The dummy wafer has a signal carrying cable bundle exiting from the circumference edge. The cable bundle is shielded with a protective ceramic sleeve and terminated with a multi pin plug. A vacuum feedthrough, with integrated RF filter module, mounted to a chamber vacuum port has a receiver port to mate with the cable plug. Thus, the RFA signals are transmitted from the sensor, located inside the vacuum chamber, to the air side via the feedthrough where the measurement electronics, controller and grid power supplies are located. The authors demonstrated successful measurement of the IED across a range of pedestal bias conditions-including RF biasing. However, a number of issues still remain that prevent more widespread adoption of this technology including, but not limited to; (a) existing RFAs are wired to a remote electronic control system which adds a parasitic impedance to ground, thus artificially impacting the pedestal RF bias conditions and the resultant IED, (b) the wiring prevents easy loading of the ion energy analyzer to the plasma processing chamber using the standard robotic loading system, (c) ion energy analyzer structures are typically many millimetres in height, making deployment on a substrate with similar thickness to a process wafer difficult while at the same time limiting the vacuum pressure range under which the device can be operated and (d) to measure the IEDs expected in typical plasma processes, an energy range of a few thousand electron volts (eV) is required to make the RFA really useful. A wafer or substrate integrated wireless RFA design for IED measurement is highly desirable to eliminate pedestal perturbation and to enable robotic loading. There are considerable technical challenges to overcome including manufacture of the wafer integrated gridded sensor stack, achieving several kilovolt scanning capability for sufficient ion energy range and meeting elevated temperature requirements for the integrated sensor power source and circuit components.

Imitation substrates with embedded sensors have been the subject of numerous patents. Some of these inventions focus on novel sensor designs and their construction, while others focus on the electronic control platform for processing, storing and transmitting the sensor data. The electronic platform is either fully integrated into the imitation substrate with its own power supply or is decoupled from the imitation substrate using interconnecting wires which pass through the chamber wall, using vacuum feedthroughs, to the electronic control platform located on the air side.

In U.S. Pat. No. 5,969,639 the inventors describe a silicon wafer probe with a plurality of integrated temperature sensors to monitor the temperature uniformity of the pedestal in various processing applications. The power source and control electronics are fully integrated therein, including the transmitter to send data to an external receiver. Data is stored in memory for later retrieval. While temperature is a useful parameter, it is not a key process driver like the ion energy distribution.

A wafer probe apparatus for measuring ion current during plasma processing is described in U.S. Pat. No. 6,830,650 B2. The apparatus consists of an imitation-substrate with integrated sensors, power source and microprocessor for storing sensor data. The power source uses stacked capacitors to collect and store energy from the plasma to power the electronic circuitry. It also has an integrated wireless transmitter for sending sensor data to a wireless receiver mounted at a vacuum port on the chamber wall. The ion sensors are simple dual-Langmuir probes consisting of flat metal disks exposed to the plasma on the top surface. These sensors provide a measure of the ion current at the surface with limited accuracy. This type of sensor does not have the ability to measure the ion energy distribution, which is of critical importance to wafer processing. It has limited accuracy because it does not include any suppression of secondary electron emission from the sensor surface which may be induced by the impacting ions being measured. The voltage range required to drive the sensor is more than an order of magnitude lower than that needed for a retarding field analyser.

In U.S. Pat. No. 2005/0115673A1, the inventors describe an imitation silicon substrate with a variety of integrated sensors including an ion energy analyzer, a VUV photon detector and a radical ion emission spectrophotometer. This device has a fully integrated power source and control electronics. Bi-direction communication with a viewport mounted receiver is performed optically. The ion energy analyzer consists of four grids including a plasma blocking grid, an incoming electron retarding grid, an ion energy separation grid and a secondary electron suppression grid. It also includes a collector electrode to record the current of ions as a function of ion energy. Grid layers and inter-grid isolation layers are formed using standard plasma etch and deposition processes. The grids and collector electrode are made from aluminium while aluminium oxide is used for electrical isolation. The grid holes or "pores" extend vertically downwards through the structure, from the plasma facing wafer surface at the top, to the collector electrode at the bottom, to allow the ion sample to pass through the device for analysis. Voltages are applied to each grid to create the electric fields required to operate the sensor. With this type of analyzer design, it is assumed that the potential in the free space that forms the grid hole or "pore" is the same as that on the metal frame. Talley et al (Plasma Sources Sci. Technol., 26, 12, 2017), among others, have shown the effect of electric field "sagging" (reduction) in the holes and the need for the inter grid spacing to be much larger than the pore dimensions to minimize the field sagging impact on functionality, especially with perfectly aligned pores as in this invention. It is doubtful that this criteria was considered given the dimensions alluded to in the description. The inventors also insulate the side walls of the grid exposed to the pore channel. This will further accentuate the field sagging effect. In the event that this is overcome with a sufficiently thin layer such that the correct voltage appears on the external surface of said layer, the likelihood of voltage flashover across the surface of the insulators to the adjacent grids, especially from the high voltage ion energy separation grid, is high. The inventors do not make clear how the high voltage ion energy separation voltage sweep is generated nor do they show any examples of measured data. The ability to use this invention relies on line-of-sight optical communication with the receiver at a remote location on the chamber wall, which may not always be practical in modern plasma processing tools.

Mahoney et al in Pat. No. WO 2005/017937 A2, and other related patents, describe an invention which consists of dual-Langmuir probes for measuring ion currents in proximity of the plasma boundary. In this invention the sensors could be embedded in a dielectric isolation ring surrounding the chuck on which the wafer is processed. The sensors are wired to the processing electronics through vacuum sealed feedthroughs in the chamber wall. This device has the same limitations in terms of measured parameters. The wired connections also limit the ease of deployment. A subsequent invention by the authors published by Roche et al in U.S. Pat. No. 2005/0034812 A1 describe a wafer-like probe with embedded sensors, a stacked capacitor power supply mechanism, a microprocessor and wireless transceiver to transmit data to a chamber mounted receiver. The inventors describe the same type of dual-Langmuir probes for sensing ion current from the plasma process, but this time embedded in a wireless imitation-wafer.

In U.S. Pat. No. 7,151,366 B2, Renken et al describe an invention that consists of an imitation-wafer equipped with battery power supply, CPU and transmitter to communicate data to an imitation-FOUP, or the like, with integrated transmitter/receiver technology to retrieve data from the wafer, where it can be accessed by the user through a computer connection, which can also be used to report to the factory host server directly. This imitation-wafer platform was designed to manage sensor data, although no sensor designs were reported in this patent.

In U.S. Pat. No. 7,960,670 B2, Mundt et al describe another wafer-like or substrate-like apparatus with embedded sensors for sensing plasma process parameters. The authors describe a plurality of capacitive sensing elements which can be configured to sense various plasma processing parameters, although no specific sensor design is described. The capacitive sensing elements are powered by transducers which produce a DC voltage proportional to the rf power used to process the wafer and are coupled to an information processor. The apparatus also has a transceiver for transmitting and receiving data. A remote communication device is envisaged for retrieving data from the apparatus but is not described in this patent.

In U.S. Pat. No. 7,875,859, Chen et al describe a method for manufacturing and using a wafer-like device with integrated ion energy analysers for measuring the IED in a processing plasma during RF biasing. The ion energy is constructed with three grids; one for plasma blocking, one for ion energy separation and one for electron suppression, and terminated with a collector electrode for detecting the ion current signal. The authors allude to separation between grids being of the order of millimetres, which renders the device usable only at low processing pressures. This design also places the ion separation grid directly below the plasma facing sampling aperture through which ions and electrons pass through. Best practice is to place the electron repeller grid directly below the plasma facing aperture so that electrons can be removed as a first priority. With the ion separation grid placed directly beneath the sampling aperture, which is necessarily biased with a positive potential sweep to separate ions based on their incoming energy, the electrons are accelerated to high energy deep into the analyzer structure before repulsion. In practice this configuration often leads to undesirable ionization inside the analyzer, caused by the accelerated electrons, thus corrupting the measured IED. The measurement electronics and power source are contained in a separate module which is tethered to the main wafer structure. As a result, rf filtering between wafer grids and power supply is essential. The additional module does not allow for robotic loading and it is not clear where this module should be located during processing. With the system not being fully contained within the wafer structure, the placement of the device risks the disturbance of the real processing conditions.

In U.S. Pat. No. 8,816,281 B2, Funk et al describe a process for manufacturing a wafer-like ion energy analyzer device consisting of a sandwich of multiple substrates. They use a light source embedded in the bottom layer to align the array of sampling apertures between each layer. The ion energy analyzer has a very simple structure with two grids and a collector electrode. The ion energy separator grid is adjacent to the entrance aperture while the collector is biased such that it provides the repulsion force for the incoming electrons while simultaneously detecting the ion current. The simplicity of this configuration is appealing but it is not a preferred configuration because a) there is no secondary electron suppression from the collector electrode and b) the electrons are accelerated deep into the device due to the positive biasing of the grid adjacent to the entrance aperture which may result in undesirable ionization within the structure, thus corrupting the measured IED.

It is clear from the above that there are numerous shortcomings with the prior art. There is a need to address these shortcomings.

SUMMARY

The present teachings describe an apparatus for obtaining ion energy distribution, IED, measurements in a plasma processing system comprising, a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulation layer, a battery power supply and control circuitry, integrated in the substrate, for supplying and controlling voltage to each of the grids and the collector of the ion energy analyser, wherein at least one insulation layer includes a peripheral portion which is of reduced thickness with respect to the remaining portion of the insulation layer.

The peripheral portion may protrude from the remaining portion of the insulation layer.

Recessed portions may be provided above and below the peripheral portion.

Optionally, the peripheral portion comprises two protruding portions with a recessed portion there between.

The apparatus for obtaining IED measurements may further comprise a Faraday shield encasing the ion energy analyser, the power supply and the control circuitry.

The apparatus for obtaining IED measurements may further comprise a gap in the faraday shield and a transponder for communicating the IED measurements from the apparatus through the gap.

The apparatus for obtaining IED measurements may further comprise a battery manager within the substrate, the battery manager configured to regulate the battery output voltage to a fixed voltage level.

The apparatus for obtaining IED measurements may further comprise a first high voltage generating circuit within the substrate, the high voltage generating circuit comprising a low voltage to high voltage transformer feeding a voltage multiplier, wherein the high voltage generating circuit takes the output voltage of the battery manager and supplies the voltage sweep to the third conductive grid, $G_2$.

Optionally, the voltage multiplier is a Cockcroft-Walton based voltage multiplier.

The apparatus for obtaining IED measurements may further comprise a microcontroller within the substrate, the first high voltage generating circuit further comprising a H-bridge to generate a low voltage AC signal for input to the primary side of transformer, wherein the AC signal frequency and amplitude are controlled by the microcontroller.

Optionally, the first high voltage generating circuit further comprises a high voltage switch for discharging the third grid to the floating ground of the apparatus.

The apparatus for obtaining IED measurements may further comprise a second high voltage generating circuit within the substrate for supplying the voltage sweep to the third grid using the voltage output of the battery manager, the high voltage generating circuit comprising a DC-DC converter and a boost section followed by a voltage multiplier section.

Optionally, the boost section comprises an inductor, L1, a transistor, Q1, a diode, D2, and a capacitor, C1, the boost circuit configured to boost the voltage output of the DC-DC converter.

The apparatus for obtaining IED measurements may further comprise a microprocessor within the substrate, wherein the transistor is controlled by a pulse width modulated signal from the microprocessor.

Optionally, the voltage multiplier is a Cockcroft-Walton based voltage multiplier.

Optionally, the voltage multiplier circuit has multiple stages and each stage increases the voltage applied to the input of the respective stage.

Optionally, the second high voltage generating circuit further comprises a high voltage switch for discharging the third grid to the floating ground of the apparatus.

The apparatus for obtaining IED measurements may further comprise a resistor in series between each grid and control circuitry.

The present teachings also relate to an apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, a battery power supply and a battery manager integrated in the substrate, for supplying and controlling voltage to each of the grids and the collector of the ion energy analyser; and a high voltage generating circuit within the substrate, the high voltage generating circuit comprising a low voltage to high voltage transformer feeding a voltage multiplier, wherein the high voltage generating circuit takes the output voltage of the battery manager and supplies a voltage sweep to the third conductive grid.

The voltage sweep applied to the third conductive grid may be ascending.

The a ion energy analyser of apparatus is configured to sample ion current while the voltage sweep is ascending.

The voltage sweep applied to the third conductive grid may be descending.

The ion energy analyser of apparatus is configured to sample ion current while the voltage sweep is ascending.

The battery manager may be configured to regulate the battery output voltage to a fixed voltage level.

The voltage multiplier may be a Cockcroft-Walton based voltage multiplier.

The apparatus for obtaining IED measurements may further comprise a microcontroller within the substrate, the high voltage generating circuit further comprising a H-bridge to generate a low voltage AC signal for input to the primary side of transformer, wherein the AC signal frequency and amplitude are controlled by the microcontroller.

The high voltage generating circuit may be configured so that controlling the frequency and amplitude of the AC signal applied to the primary winding of the transformer determines the voltage applied to the third conductive grid.

The high voltage generating circuit may further comprise a high voltage switch for discharging the third grid to the floating ground of the apparatus.

The high voltage generating circuit may further comprise a resistor in parallel with the high voltage switch.

The resistor determines the discharge time of the voltage when the voltage generating circuit is configured to apply a descending voltage sweep to the third grid.

The apparatus for obtaining IED measurements may be further configured so that the voltage sweep applied to the third conductive grid is continuous The apparatus for obtaining IED measurements may be further configured so that the voltage sweep applied to the third conductive grid is a staircase function The apparatus for obtaining IED measurements may further comprise a resistor in series between each grid and the control circuitry.

The present teachings also relate to an apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, an battery power supply and a battery manager integrated in the substrate, for supplying and controlling voltage to each of the grids and the collector of the ion energy analyser, and a high voltage generating circuit within the substrate, the high voltage generating circuit comprising for comprising a DC-DC converter and a boost section followed by a voltage multiplier section, wherein the high voltage generating circuit takes the output voltage of the battery manager and supplies a voltage sweep to the third conductive grid.

The voltage sweep applied to the third conductive grid may be ascending.

The ion energy analyser of apparatus may be configured to sample ion current while the voltage sweep is ascending.

The voltage sweep applied to the third conductive grid may be descending.

The ion energy analyser of apparatus may be configured to sample ion current while the voltage sweep is ascending.

The battery manager may be configured to regulate the battery output voltage to a fixed voltage level.

Optionally, the voltage multiplier section is a Cockcroft-Walton based voltage multiplier.

The boost section may comprise an inductor, L1, a transistor, Q1, a diode, D2, and a capacitor, C1, the boost circuit is configured to boost the voltage output of the DC-DC converter.

The apparatus for obtaining IED measurements may further comprise a microprocessor within the substrate, wherein the transistor is controlled by a pulse width modulated signal from the microprocessor.

The high voltage generating circuit may further comprise a high voltage switch for discharging the third grid to the floating ground of the apparatus.

The high voltage generating circuit may further comprise a resistor in parallel with the high voltage switch.

The resistor determines the discharge time of the voltage when the voltage generating circuit is configured to apply a descending voltage sweep to the third grid.

The apparatus for obtaining IED measurements may be further configured so that the voltage sweep applied to the third conductive grid is continuous The apparatus for obtaining IED measurements may be further configured so that the voltage sweep applied to the third conductive grid is a staircase function The apparatus for obtaining IED measurements may further comprise a resistor in series between each grid and the control circuitry.

The present teachings also relate n apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, an battery power supply and a battery manager integrated in the substrate, for supplying and controlling voltage to each of the grids and the collector of the ion energy analyser, and a high voltage generating circuit within the substrate, the high voltage generating circuit comprising a high voltage pulse generator feeding a voltage multiplier, wherein the high voltage generating circuit is configured to take the output voltage of the battery manager and supply a voltage sweep the third conducive grid.

The voltage pulse generator may be configured to take the output voltage of the battery manager and provide a high voltage pulse train to the voltage multiplier.

The voltage multiplier may be configured to output a voltage multiple times the voltage received from the pulse generator.

The apparatus for obtaining IED measurements may further comprise a high voltage switch for discharging the third grid to the floating ground of the apparatus.

Optionally the voltage generating circuit further comprises a resistor in parallel with the high voltage switch.

The present teaching also relate to an apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, an battery power supply and a battery manager integrated in the substrate, for supplying and controlling voltage to each of the grids and the collector of the ion energy analyser, and a high voltage generating circuit within the substrate and configured to take the output voltage of the battery manager and supply a descending voltage sweep to the third conductive grid, wherein the ion energy analyser is configured to sample ion current while the voltage sweep is descending.

The high voltage generating circuit further may further comprise a high voltage switch for discharging the third grid to the floating ground of the apparatus.

The voltage generating circuit further may further comprise a resistor in parallel with the high voltage switch.

The present teachings also relate to an apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, a battery power supply and control circuitry, integrated in the substrate, for supplying and controlling voltage to each of the grids and the collector of the ion energy analyser, and a resistor provided between the control circuitry and one of the conductive grids to prevent plasma formation between the one of the conductive grids and an adjacent conductive grid.

The control circuitry may comprise a high voltage generating circuit configured to take the output voltage of the battery and supply a voltage sweep to the third conductive grid.

The apparatus may further comprising a resistor provided between the high voltage generating circuit and the third conductive grid to prevent plasma formation between the third conductive grid and an adjacent conductive grid.

The present teachings describe an apparatus for obtaining ion energy distribution, IED, measurements in a plasma processing system comprising, a substrate for placement in the plasma processing system and exposed to the plasma, an ion energy analyser disposed in the substrate for measuring the ion energy distribution at the substrate surface during plasma processing, the analyser comprising a first conductive grid, $G_0$, a second conductive grid, $G_1$, a third conductive grid, $G_2$, a fourth conductive grid $G_3$, and a collection electrode, C, each grid separated by an insulating layer, a battery power supply including control circuitry, integrated in the substrate, for supplying and controlling voltage to each of the grids and the collector of the ion energy analyser, and a Faraday shield encasing the ion energy analyser, the power supply and the control circuitry.

Optionally, the first grid, $G_0$, is electrically connected to, and forms part of, the Faraday shield.

Optionally, the substrate is silicon and the Faraday shield is formed by a conductive layer within the silicon, the layer encasing the ion energy analyser, the power supply and the electronic control circuitry.

BRIEF DESCRIPTION OF THE DRAWINGS

The present application will now be described with reference to the accompanying drawings in which:

FIG. 2(a) shows an array of sensors for measuring IED distributed across the surface of a wafer probe;

FIG. 2(b) shows one arrangement of grids within a sensor of FIG. 2(a);

FIG. 2(c) shows another arrangement of grids within a sensor of FIG. 2(a);

FIG. 2(d) shows a further arrangement of grids within a sensor of FIG. 2(a);

FIG. 6 shows a preferred potential configuration of the grids of the sensor;

FIG. 7 shows two graphs, one showing ion current versus voltage applied to a grid of the sensor and the other graph showing the resultant IED;

DETAILED DESCRIPTION OF THE DRAWINGS

The present teaching will now be described with reference to FIG. 1. This figure illustrates an overview of a system 100 that is capable of measuring the ion energy distribution arriving at the wafer probe 101 surface during plasma processing. In this particular illustration, the diagnostic system 100 includes an imitation wafer probe with integrated ion energy analysers, electronic control circuitry, battery power supply and wireless communication. The diagnostic system further comprises a docking station 102 with integrated wireless transponder 103 to enable imitation wafer probe 101 charging, configuration and data retrieval. The docking station 102 is equipped with Ethernet connectivity to communicate with a host PC 104. Application software is provided to display and analyse retrieved data. The application software provides a control panel for scheduling the experimental assignments. An advanced programming interface (API) is also provided to allow direct interaction between the docking station and factory control software.

Figure 1:
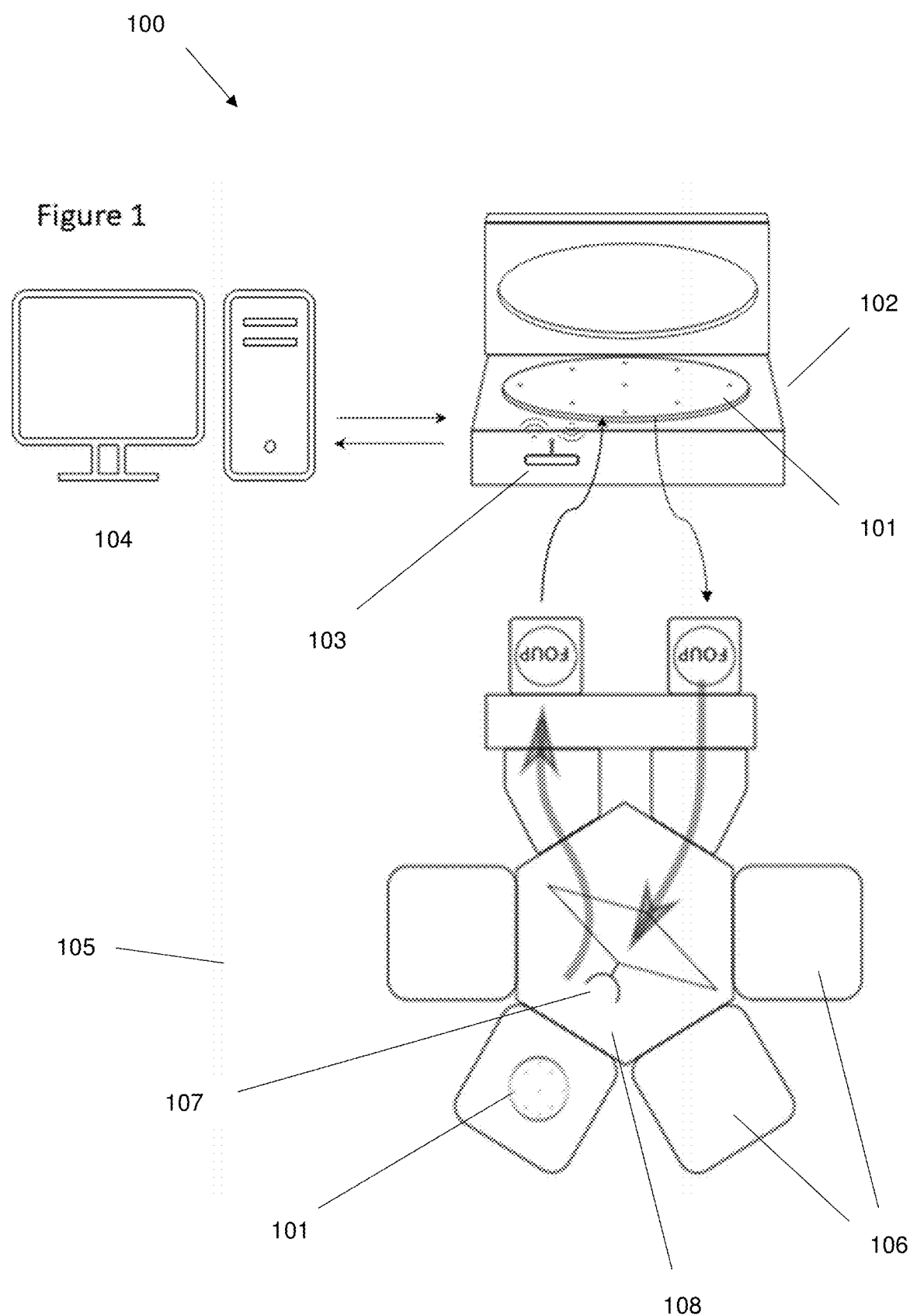
FIG. 1 shows an overview of a system in accordance with the present teachings that is capable of measuring the ion energy distribution arriving at ta wafer probe surface during plasma processing.

A four chamber plasma processing system 105 is also shown in FIG. 1. This is one of many different types of plasma processing system and is used to illustrate the functionality of the imitation wafer probe 101 in accordance with the present teachings. The plasma processing system 105 may have one or more interconnected processing chambers 106. Each processing chamber 106 is equipped with vacuum pumps to evacuate the chamber, gas flow controls to set the process recipe, vacuum gauges and transducers to regulate process operating pressure, power delivery mechanism to excite the chemical recipe to the plasma state and a pedestal to hold the substrate during processing. A load lock chamber 108 with robotic transfer mechanism 107 is used to transport substrates to and from the processing chambers. Substrate batches are delivered to the load lock chamber 108 through a cassette or FOUP.

In the preferred embodiment, the wafer probe 101 is placed in the docking station 102 and communication is established through the application software on the host PC 104. The battery power supply on the wafer probe 101 is charged, stored data retrieved and the next experimental assignment scheduled to prime the wafer probe 101. The imitation wafer probe 101 is then placed in an available slot in a Front Opening Universal Pod (FOUP) which is subsequently delivered to the load lock chamber 108. The robotic arm 107 transports the imitation wafer probe 101 to the processing chamber 106 and positions it on a processing pedestal in preparation for plasma exposure. With the chamber 106 already under vacuum, the process recipe is configured and plasma ignited. When plasma is formed, plasma species begin to bombard the wafer probe 101, a sample of which enters the sensors of the probe 101 for analysis. Analysis proceeds at the times configured in the scheduler if the on-board pressure sensor reports that the threshold for high voltage application has been met. This safety mechanism prevents the accidental application of high voltage at atmospheric pressure, which could destroy the sensor due to electrical arcing. If the pressure threshold has been met, the wafer probe 101 is activated at the scheduled time. The appropriate voltages are applied to all the grids and collector, the collector current is recorded as a function of ion discrimination potential by a microcontroller (MCU), not shown, and the resultant data is stored in memory. The wafer probe 101 returns to sleep mode until the next scheduled measurement, at which point the process is repeated. When the experimental assignment is completed, the plasma process may be terminated to allow retrieval of the wafer probe 101 from the processing pedestal using the robotic arm which transports the wafer probe back through the load lock chamber 108 to the FOUP. The user extracts the wafer probe 101 from the FOUP and places it back in the docking station 102 for data retrieval, recharging and scheduling of the next experimental assignment. Alternatively, it is possible for the wafer probe to transmit the sensor data in real-time to the docking station, from its location inside the processing chamber, using known wireless communication apparatus and methodology.

The configuration of the wafer probe 101 will now be described in more detail. In the preferred embodiment the wafer probe 101 can be fabricated on a silicon wafer base to mimic the standard semiconductor work piece. It may also be manufactured on other materials such as ceramic, metal or glass to mimic other types of substrates used in plasma processing, and may have the same geometry as a standard substrate with substantively the same dimensions and weight. An example of one such configuration is shown in FIG. 2(*a*) which depicts an array of sensors (or sensor stacks) 201 distributed across the surface of a semiconductor wafer probe 101. In particular, FIG. 2(*a*) shows a plan view of a 300 mm wafer probe 101 with nine sensors 201. An alignment notch 202 is also shown. As will be explained in more detail hereinafter, these sensors 201 are preferably ion energy analysers for measurement of ion energy distribution at the substrate surface of the wafer probe 101.

FIG. 3(*a*) shows one possible architecture where each sensor 201 of the wafer probe 101 is modularised having its own dedicated power source, signal conditioning circuit, MCU, pressure sensor and wireless transponder.

In an alternative architecture, the electronic control circuit is centralised and the individual collector currents from each sensing element are multiplexed to a centralised measurement circuit as shown in FIG. 3(*b*).

The ion energy analyser 201 is of particular interest for measuring the ion energy distribution at the substrate surface during plasma processing. Turning to FIG. 2(*b*), it can be seen that the ion energy analyser 201 comprises alternating layers of planar, parallel, conductive metal grids and insulators, the grids being electrically polarised in a systematic way to filter out plasma electrons, separate positive ions based on their energy, suppress secondary electron emission and collect ion current for measurement.

In FIG. 2(*b*), the plasma facing top surface 203 of the sensor 201 is flush with the substrate surface and made from the same material. An array of sampling apertures 204 are formed in this top surface 203, through which plasma species enter the device for analysis. The sampling apertures 204 can be sub millimetre in diameter and must provide sufficient open area to deliver adequate charged particle flux for detection. At the onset of plasma formation in the processing chamber a plasma sheath forms adjacent to the surface of the substrate and all other surfaces exposed to the plasma. The voltage applied to the sheath is used to manipulate the ion energy arriving at the substrate surface. The presence of the sensor apertures 204 have the potential to inhibit local sheath formation in the vicinity of said apertures. Any aperture exposed to the plasma should have dimensions that are smaller than the plasma Debye length ($\lambda_D$) to enable sheath formation above the aperture and thus prevent plasma penetration through the aperture. The $\lambda_D$ can be calculated using $$\lambda_D = \left(\frac{\varepsilon_0 kT_e}{n_e e^2}\right)^{0.5} \tag{1}$$

where $\varepsilon_0$ is the vacuum permittivity, $kT_e$ is the electron temperature, $n_e$ is the electron density and e is the electronic charge. Using typical plasma processing conditions, with electron temperature of 3 eV and electron density of $10^{17}$ m$^{-3}$, the Debye length is approximately 40 microns. Therefore, the apertures, typically being on a scale of millimetres, may not meet the sub-Debye length criterion in isolation.

In the embodiment illustrated in FIG. 2(*b*), a first conductive grid (or mesh), referred to as $G_0$ henceforth, is attached to the underside of the apertures 204 with good electrical connection between both surfaces. The grid $G_0$ is manufactured with sub-Debye length aperture size to guarantee plasma screening and has sufficient open area ratio to transmit sufficient ion flux for detection.

In another embodiment, $G_0$ can be attached to the plasma facing side of the apertures to achieve the same functionality as illustrated in FIG. 2(*c*).

In an alternative embodiment, the apertures 204 are manufactured directly in the plasma facing surface with sub-Debye length dimensions and in sufficient numbers to maintain adequate ion flux for detection, thus eliminating the need for an independent $G_0$. This embodiment is s illustrated in FIG. 2(d).

In each configuration of 2(a), 2(b) and 2(c), $G_0$ adopts the same potential as the wafer probe outer body, determined by the excitation potential applied to the processing pedestal and the plasma properties. This potential acts as the reference potential for the sensor circuitry and the inter-grid electric field formation.

A first insulation layer 205 is disposed proximate to $G_0$, to provide electrical isolation from other grids e.g., $G_1$, $G_2$, and $G_3$. The insulation layer 205 can be made up of one or multiple insulators. Insulators may have an aperture array matching the ion sampling aperture array to allow ions pass through unimpeded. Insulators may alternatively have a single, large diameter aperture with open area spanning the entire aperture array.

Figure 3A:
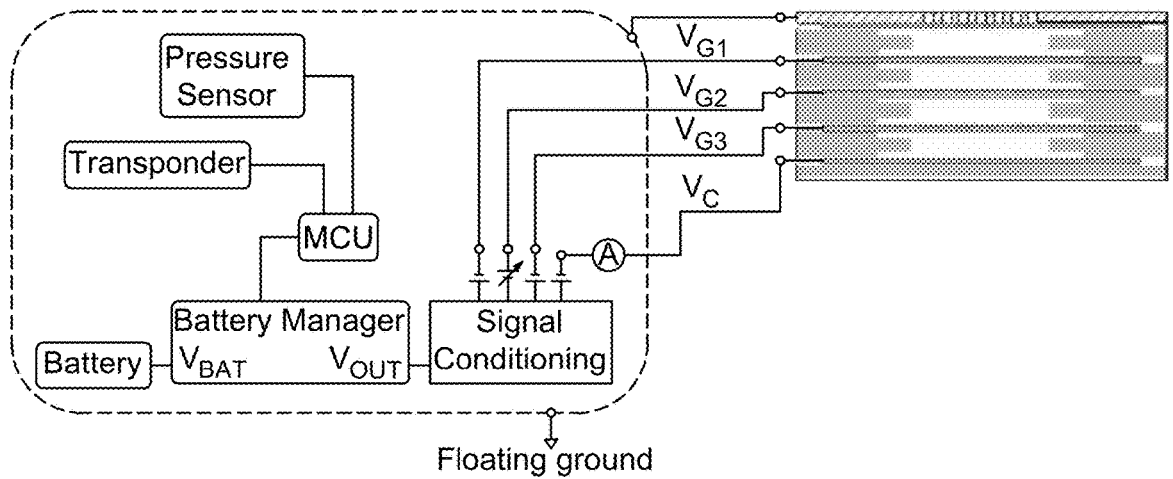
FIG. 3(a) shows one configuration for providing power to a sensor.
Figure 3B:
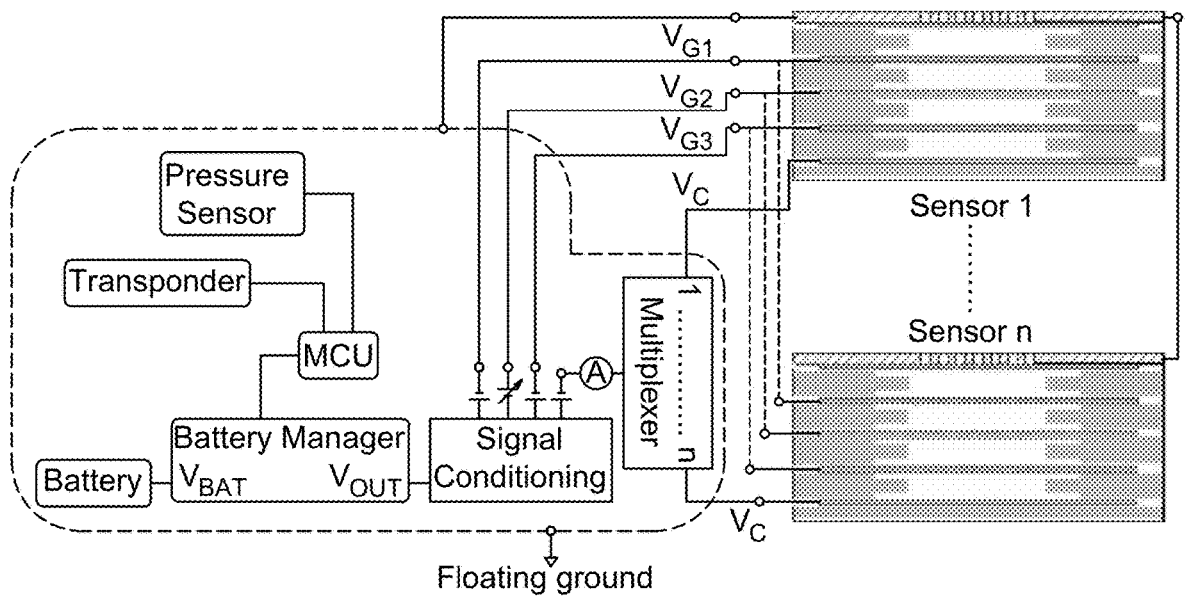
FIG. 3(b) shows another configuration fro providing power to a sensor.
Figure 4A:
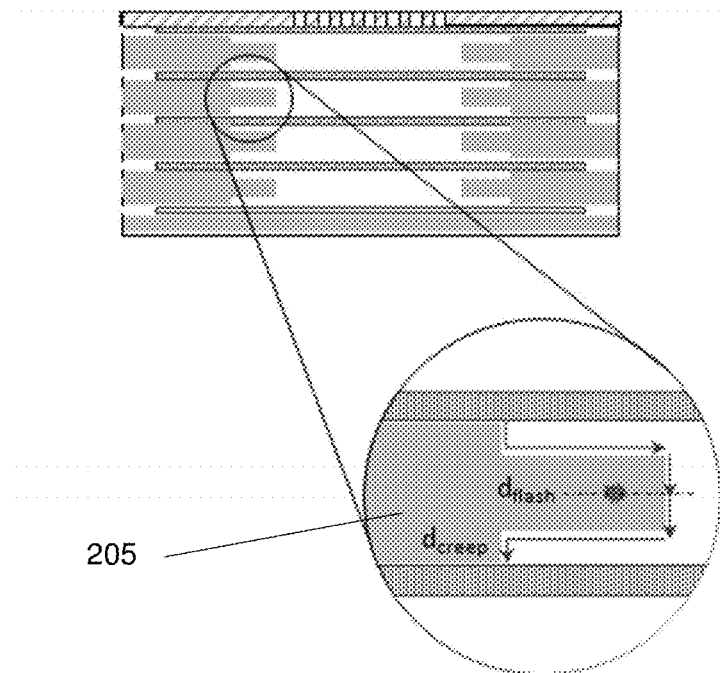
FIG. 4(a) shows a possible configuration for an insulation layer within a sensor.

In FIG. 4(a) an illustration of one suitable insulation layer structure is depicted. The insulation layer 205 is stepped such that it protrudes further in the central region and is recessed above and below where it comes into contact with the adjacent grids. That is, the insulation layer includes a peripheral portion of reduced thickness with respect to the remaining portion of the insulation layer. The insulation layer structure is designed such that the shortest path along the insulating surfaces between adjacent grids, also known as the voltage creep distance ($d_{creep}$), is larger than the voltage flashover distance ($d_{flash}$) for the insulation material. Therefore, $d_{creep}$ is predetermined by the maximum potential difference to be applied between the grids as illustrated in FIG. 3. While the distance between the grids is shorter across the air gap region it does not present a voltage breakdown concern since the sensor is to be operated at low pressure where the breakdown voltage across said gap is many tens of kilovolts as defined by the Paschen law. The insulation layer 205 thickness is in the millimeter or sub-millimeter range, depending on the application, typically several hundred micrometres is used. The total transit distance for ions passing through the analyzer should be less than the ion mean free path to avoid collisions and thereby preserve the integrity of the measured IED.

Figure 4B:
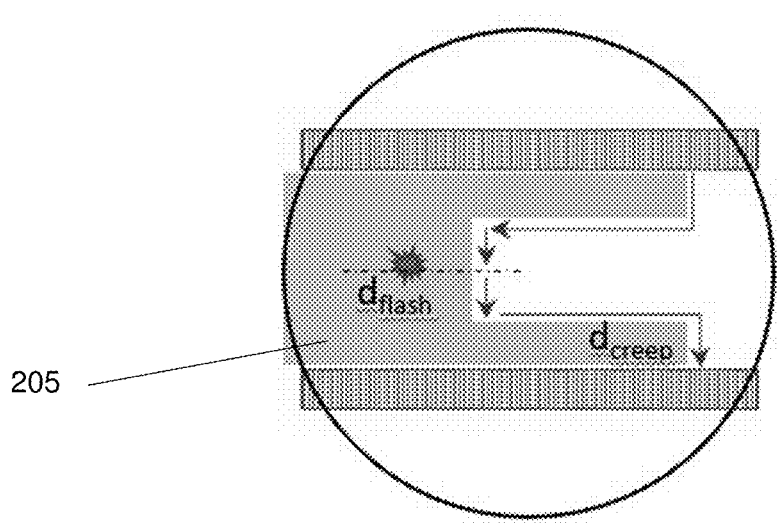
FIG. 4(b) shows another possible configuration for an insulation layer within a sensor.

FIG. 4(a) shows a protruding central region which elongates the path length. The same result could be achieved with a slightly different structure as shown in FIG. 4(b). That is, FIG. 4(b) shows another configuration for the insulation layer to prevent voltage flashover between the grids, which relies on two protruding portions with a recessed portion there between at the periphery of the insulation layer.

The protruding portions of FIGS. 4(a) and 4(b) can be considered as tongues while the recessed portions can be considered as grooves. Each embodiment could include multiple tongues and/or grooves to achieve the same effect.

It should be appreciated that the present teachings are not limited to the stepped insulation layer described above with reference to FIGS. 4(a) and 4(b). The grid stack can function without the stepped insulator layers. However, the separation between grids would have to be increased to work at high voltages. In addition, the stepped insulation layer is also useful for wired IED analysers previously described. It is suitable for analysers hat do not include an integrated power supply i.e., analysers which receive power from an external source. Adding the stepped insulators allows an extension the energy range without sacrificing the pressure range. An alternative shape to the stepped configuration which also provides a reduced thickness at the peripheral portion or region of the insulation layer can also be used.

Turning back to FIG. 2(b), a second grid, henceforth referred to as $G_1$, is disposed proximate to the first insulator 205 with identical or similar geometrical characteristics to $G_0$ in terms of aperture size and open area ratio. $G_1$ is coupled to a first voltage source and biased negatively with respect to $G_0$, thus creating the retarding electric field required to repel the incoming plasma electrons. A second insulation layer 206 with identical or similar dimensions to the first insulation layer is disposed proximate to $G_1$. A third grid, henceforth referred to as $G_2$, with identical or similar geometry to the other grids is disposed proximate to the second insulation layer. $G_2$ is coupled to a second voltage source and biased with a positive potential sweep relative to $G_0$ thus creating the electric field required for ion energy discrimination. A third insulation layer 207, with identical or similar dimensions to the other insulation layers, is disposed proximate to $G_2$. A fourth grid, henceforth referred to as $G_3$, with identical or similar geometrical characteristics to the other grids is disposed proximate to the third insulation layer 207. $G_3$ is coupled to a third voltage source and biased negatively with respect to the collector, thus creating the electric field required for suppressing secondary electron emission from the collector. A fourth insulation layer 208 with identical or similar dimensions to the other insulation layers is disposed proximate to $G_3$. An ion collection electrode, the collector, C, is disposed proximate to the fourth insulation layer 208. The collector is coupled to a fourth voltage source, through a current measurement circuit, and biased negatively with respect to $G_0$ to establish an attractive electric field to draw ions towards the collector for detection. A final insulation layer 209 is disposed between the collector electrode and the back plate of the sensor chassis. The grids are typically made from metals such as nickel or stainless steel but any other process compatible conductive material can be used. The insulators are typically made from ceramic, mica or other process compatible insulating material.

Turning back to FIGS. 3(a) and 3(b) it can be seen that the signal conditioning provides a voltage source for each of grids $G_1$, $G_2$ and $G_3$ as well as the collector described above. The voltage provided to $G_2$ is variable. A more detailed configuration for the generation of the voltage to $G_2$ is described with respect to FIGS. 8 and 9. However, it should be appreciated that any known signal conditioning circuitry in combination with the battery could be used to provide a variable voltage to grid $G_2$.

Figure 5A:
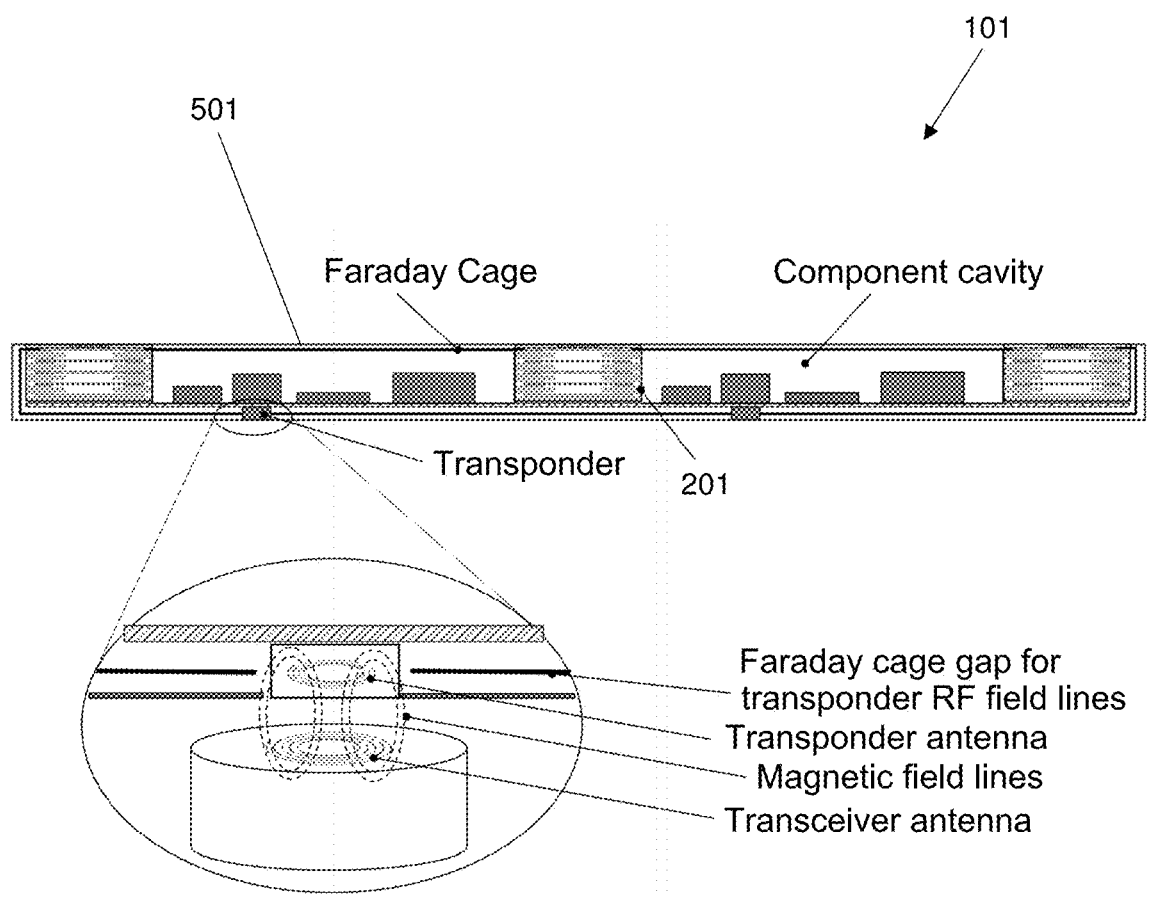
FIG. 5(a) shows a cross section of a wafer probe in accordance with the present teaching which incorporates a Faraday shield.

A key feature of the invention in accordance with the present teachings is the incorporation of all electronic circuitry proximate to the ion energy analyser (grid stacks) 201 and within a carefully constructed Faraday cage whereby the $G_0$ grids are electrically connected to, and form part of, a continuous electrically conducting shield that fully encases the ion energy analyzer stack, control electronics and battery as illustrated in FIG. 5(a). In particular, FIG. 5(a) shows a cross section view of the wafer probe 101 through the diameter (not to scale). It shows the Faraday cage surrounding the sensors or ion energy analysers 201 and associated electronics including the power supply (not shown). It shows the machined cavities where all electronic components are fitted.

In FIG. 5(a) the Faraday shield is shown with respect to a silicon substrate. For silicon an additional conductive layer (metal) 501 within the structure is added to create the Faraday shield. Once the grid stack and circuitry have been installed in the substrate, a cover (lid or back plate) is used to seal it off. For a silicon cover, it will have a metal layer on one side to make up the Faraday shield.

The substrate need not be silicon and can be metallic. In this case, it would be machined in the same way, but no additional Faraday shield layer is required. This would look substantially like the configuration of FIG. 5(a) without the additional conductive layer 501. The substrate itself would function as the faraday shield. The lid in this case is a metal layer with the same material as the substrate. Typical metals that might be used include aluminium, stainless steel and Nickel.

The Faraday shield is electrically floating at the same potential as the surface on which it is seated and acts as the reference potential for all electronic circuitry enclosed therein. The Faraday shield prevents undesirable electric field formation within the ion energy analyser grid stack 201, due to electromagnetic interference, which would distort the IED measurement.

In prior art designs, where the control electronic system is located remotely, the Faraday shield cannot be perfectly maintained. Cables must be connected between the analyzer and remote location to carry the electrical signals. For RF biased applications this poses a significant problem. For precise operation, all grids within the ion energy analyzer structure must float at the RF bias potential. Once the Faraday shield is compromised by wiring to a remote location, the grids become decoupled from the RF bias potential. The wired grids have a finite electrical impedance to ground, as opposed to the infinite impedance to ground in the fully Faraday shielded embodiment. Previously referenced Gahan et al describe how to address this problem in their 2008 publication. Firstly, high impedance low-pass filters are placed in series with all cables, between the analyzer grids and the remote location, as close to the grids as is practical. Secondly, the capacitance between each grid and the aperture surface is maximised to optimise the RF coupling. These requirements make the remote design complicated to implement, the grids can never be perfectly coupled to the RF bias and the filter impedance can never be infinite to prevent parasitic loading of the pedestal impedance.

The current invention circumvents these design complications by removing the cabling to ensure an almost perfectly floating solution thereby closely matching the conditions at the pedestal when an unencumbered silicon wafer is used.

In prior art designs where the control electronic system and power supply is fully integrated into an imitation wafer probe, undesirable electric field formation also occurs which distort the IED measurements.

Turning back to FIGS. 2(b) and 2(c), the apertures 204 are manufactured in the plasma facing surface of the wafer probe 101 substrate and constitute the top surface of the ion energy analyser 201. In one embodiment the substrate is a 100 mm, 150 mm, 200 mm, 300 mm or 450 mm diameter silicon wafer, but any other material, geometry or dimensions can be used in the manufacture of the wafer probe as required by the application. The imitation wafer probe 101 may comprise a single point measurement sensor 201 or comprise a plurality of spatially distributed measurement sensors 201.

To manufacture the imitation wafer probe 101 a base substrate with the desired geometry and dimensions is machined to form cavities therein to fit the sensing elements and the electronic components. In one embodiment, the circuit footprint and components are disposed directly on the base substrate. In another embodiment the circuit footprint and components are disposed on a separate panel(s) and fitted in the machined cavity(s) in the base substrate and fixed in place. An electrically conductive plane is disposed on the underside of the wafer probe aperture plane, part of which is formed by the $G_0$ elements used for plasma screening. At each of the individual ion energy analyzer sites, the layers of alternating grids and insulators are formed independently. In one embodiment the ion energy analyser 201 is a replaceable part fitted to the wafer probe assembly which necessarily increases the imitation wafer probe 101 height but is more convenient. In another embodiment the ion energy analyser 201 is a permanently integrated part of the imitation wafer probe 101 and is non-replaceable allowing a lower profile wafer probe 101 to be manufactured. The grids and insulators are mechanical components which are placed and fixed in position. One manufacturing method involves embedding the layers in a ceramic based printed circuit board (PCB) using PCB manufacturing techniques. Another manufacturing method involves the printing of the grid and insulator layers using thick film printing techniques. The electronic circuit components are disposed adjacent to the ion energy analyzer grid stacks. Electronic components in bare die form, where necessary given height restrictions, are wire bonded in position. The components are hermetically sealed using a sealing compound to prevent outgassing during plasma processing. Once the probe components are assembled, the wafer probe 101 is sealed on the backside with a suitably manufactured wafer or panel to complete the fabrication. A metal conductive layer may be disposed on the internal plane of this enclosing wafer or panel to complete the previously described Faraday shield or the Faraday shield may be completed on the component board already installed.

A low profile battery is used to power the electronic control system. The battery may be rechargeable but is not limited to such a configuration. A pressure sensor may be incorporated and used as a safety mechanism, to indicate when it is safe to initiate the high voltage output to the grids. At atmospheric pressure, a few hundred volts would cause electrical breakdown between grids given the typical separation. The pressure sensor is used to indicate when the pressure drops to a safe level, as defined by the Paschen curve, before initiating the high voltage output. Once the pressure drops, it can be safely assumed that the wafer probe 101 is in the plasma chamber and under vacuum. A microcontroller with integrated flash memory module and analog to digital converter (ADC) controls the signal conditioning circuitry, records the ion current as a function of discrimination voltage, stores data in memory and configures the wireless transponder for data transmission.

Accurate measurement of the ion energy distribution arriving at the substrate surface during plasma processing is critical for process analysis and control. The ion energy analyser 201 described in the present teachings provides such a measurement. The ion energy analyser sensing element 201 comprising the grid stack described heretofore is configured to have an electric field profile appropriate for ion energy distribution measurement. The preferred potential configuration and the basic working principle is illustrated in FIG. 6. $G_1$ is biased with a constant negative potential relative to $G_0$. This creates an electric field to repel plasma electrons entering the analyzer. $G_2$ is biased with a positive voltage sweep to sequentially reflect ions with higher energy. At each voltage step within the sweep only ions with sufficiently high energy can pass through for detection. The current of ions reaching the collector is recorded for each step in the voltage sweep. This provides a current versus voltage characteristic equivalent to the integral form of the ion energy distribution.

FIG. 6 shows a potential diagram of the grids where $G_0$ is the reference, $G_1$ is negative and repels electrons. $G_2$ starts at 0V and sweeps positive to gradually repel ions with higher and higher energy. $G_3$ is negative to suppress secondary electrons emitted from the collector. The collector is slightly negative to attract ions for detection.

A first derivative of the current versus voltage characteristic is performed to reveal the ion energy distribution as illustrated in FIG. 7. A more scientifically correct name for this distribution is the "ion current versus energy distribution" but has become known as the ion energy distribution in the published literature.

In particular, the top graph of FIG. 7 shows ion current versus voltage applied to grid $G_2$. The produces the integrated from of the IED. The lower graph of FIG. 7 is the first derivative of the top curve showing the resultant IED. The X axis is converted from voltage to energy.

Another feature of the present teachings is the method and configuration used for generation of a sufficiently high $G_2$ voltage sweep range to adequately measure the IED found in common plasma processes. Many of the plasma processes encountered generate ions with energies ranging from a few tens of eV to a few thousands of eV. This requires the $G_2$ voltage sweep range to extend from zero volts to a few thousand volts, relative to $G_0$, to adequately probe the IED in various industrial processes.

However, it should be appreciated that the configurations described herein for providing power to grid $G_2$ does not have to be used to provide the previously described voltage sweep to grid $G_2$. Rather, a known battery driven power source could be used and the other features of the present teachings could be used in conjunction with such known battery driven power source.

Figure 8A:
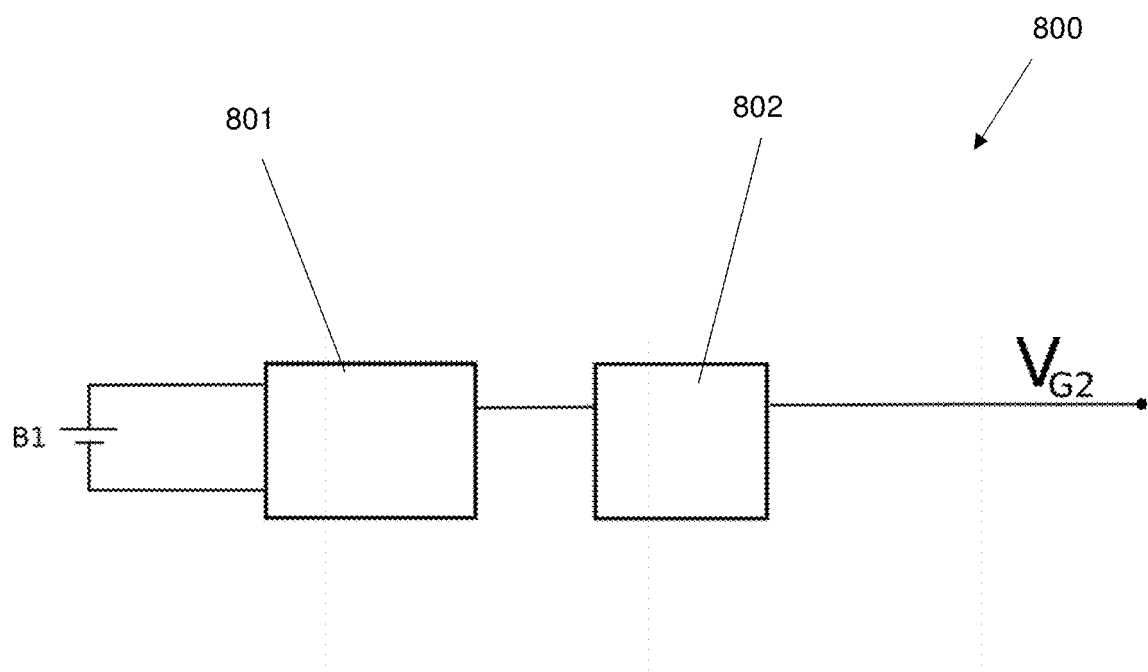
FIG. 8(a) shows a configuration for a high voltage generating circuit in accordance with the present teachings.

FIG. 8(a) shows the general configuration of a high voltage generating circuit 800, which can be used to generate the required high voltage sweep. This circuit includes two stages which take the low voltage of a battery and generate the required high voltage sweep. Specific details of possible configurations of each stage are described hereinafter with respect to FIGS. 9 and 10. However, it will be appreciated that each stage is not limited to the details of FIGS. 9 and/or 10.

In FIG. 8(a), the circuit comprises a low voltage supply B1, a high voltage pulse generator 801 (first stage) and a voltage multiplier 802 (second stage). The voltage multiplier 802 is also known as a charge pump in the art. The high voltage pulse generator 801 provides a high voltage pulse train to the voltage multiplier 802. The voltage multiplier 802 uses the pulse train to charge a series of internal capacitors to charge the output to a voltage multiple times the pulse voltage from the pulse generator 801, typically 4 to 5 times.

It will be appreciated the high voltage generating circuit can be included in the signal conditioning circuitry outlined with respect to FIGS. 3(a) and 3(b). It will also be appreciated that the battery manager circuitry (explained in more detail below) shown in FIGS. 3(a) and 3(b) can be provided in circuit 800. The battery manager circuit regulates the battery output voltage to a fixed voltage level. In an exemplary embodiment, the low voltage supply may be a single cell LiPo battery with a 3v DC regulator.

The circuit of FIG. 8(a) generates the voltage sweep starting at zero and gradually increases to the maximum i.e., an increasing voltage sweep. Ion current is sampled as the sweep increases. However, it has been found that a rapid ramp up of the voltage and a slow release results in improved battery performance, That is, less power is taken from the battery for each sweep. Therefore, the sensor can be used for a longer period of time before the battery needs to be replaced or recharged.

Figure 8B:
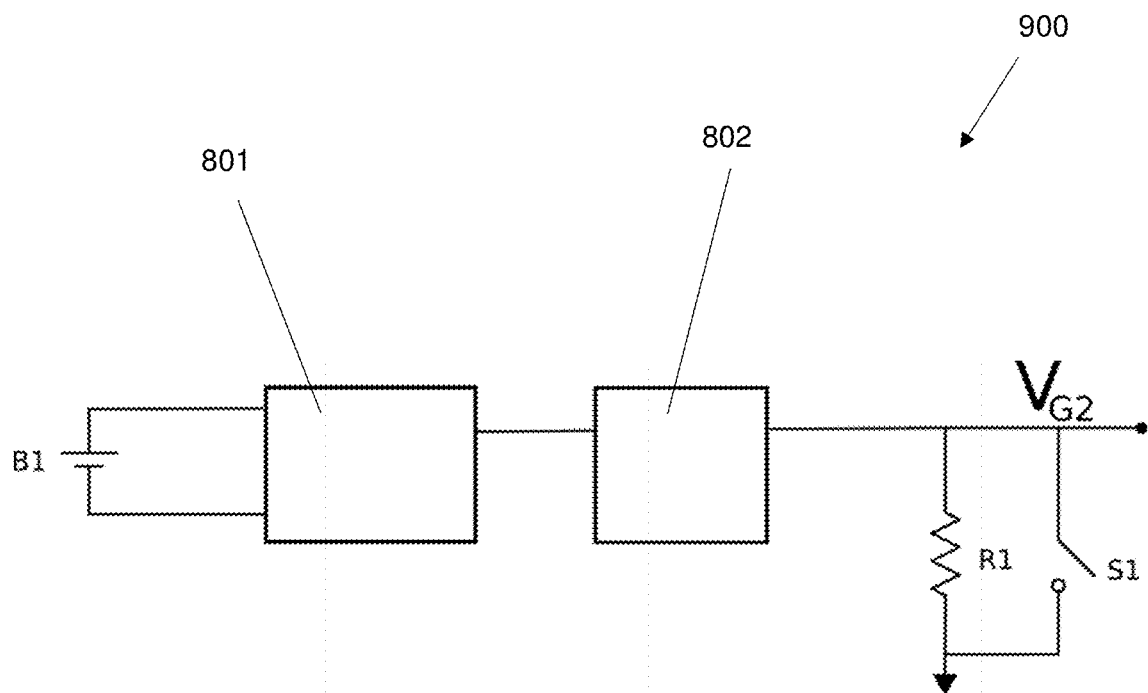
FIG. 8(b) shows another configuration for a high voltage generating circuit in accordance with the present teachings.

The high voltage generating circuit 900 used to quickly ramp the voltage to the maximum level and then slowly sweep it back to zero is shown in FIG. 8(b). very similar to the circuit of FIG. 8(a) but some further elements are required. This is shown in FIG. 8(b). A discharge resistor, R1, is added to control the discharge rate, i.e. timing, for the voltage sweep. A discharge switch, S1, is also added to discharge $V_{G2}$ prior to the voltage sweep being applied to $V_{G2}$. That is, the switch between the high voltage output to $G_2$ and the floating ground is used to discharge $G_2$ immediately before the voltage sweeping process is initiated. Ion current is sampled as the voltage decreases.

In an exemplary embodiment, the circuit 900 allows $V_{G2}$ to be rapidly charged to just over 2 kV within 5 milliseconds and $V_{G2}$ is then allowed discharged slowly via R1 over a period of up to 1 second.

Figure 9:
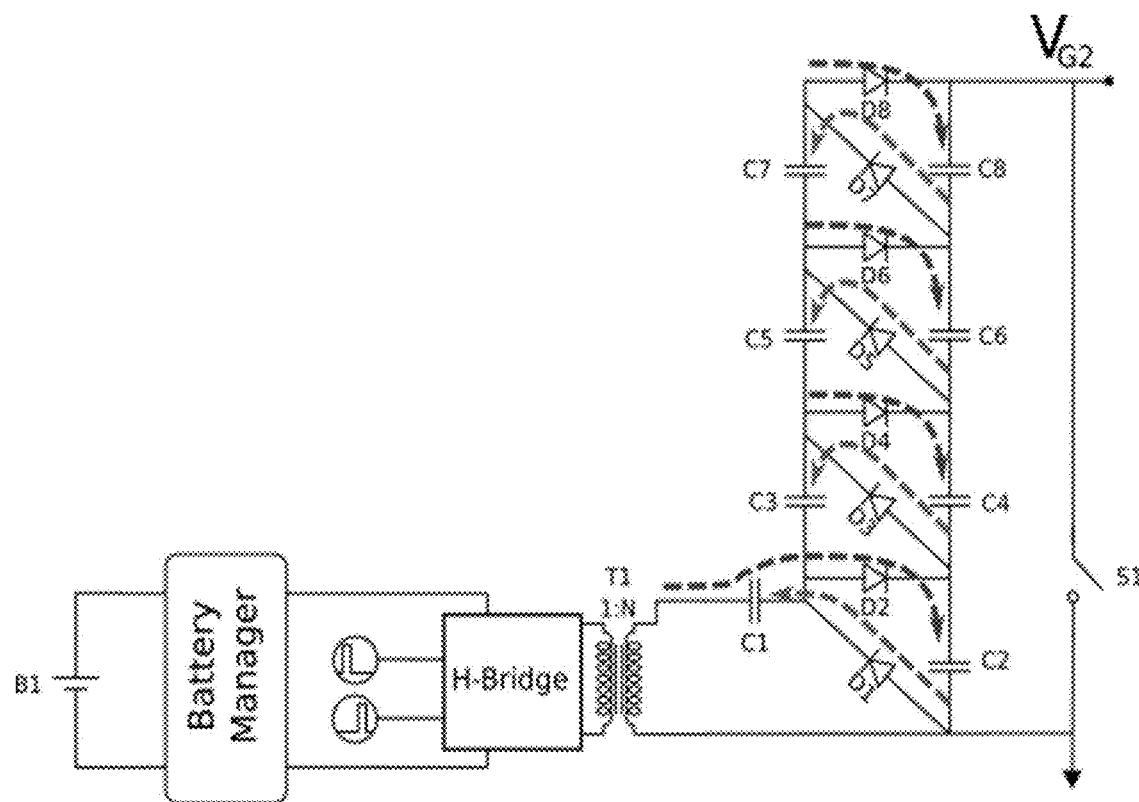
FIG. 9 shows one circuit configuration for providing a high voltage sweep to a particular grid of a sensor.

In another configuration for the high voltage generating circuit, the microcontroller (MCU in FIGS. 3(a) and 3(b)), powered by the battery, is programmed to output a sinusoidal AC voltage which is swept across a range of frequencies. The output is coupled to the primary winding of a step-up transformer. The number of turns in the secondary winding is chosen to step up the voltage to the maximum level required for a particular frequency applied to the primary winding input. At the secondary winding output the voltage is rectified to generate a direct current (DC) voltage which may be coupled to a voltage multiplier (stage two) to further multiply the voltage to enhance the voltage range as required. The DC voltage generated at the output of the secondary winding is frequency dependent. By sweeping the frequency and/or amplitude of the AC signal applied to the primary winding, the DC voltage at the output of the secondary winding or multiplier is swept across the required voltage range from zero volts to a few thousand volts depending on the transformer turns ratio used. The current is sampled at regular voltage intervals in the high voltage sweep using an ADC to build up the current voltage characteristic. Such a means is illustrated in FIG. 9 but will be explained in more detail below. It should be appreciated that while a four stage voltage multiplier (quadrupler) is used in the exemplary embodiment, any number of stages can be chosen as appropriate by the person skilled in the art.

Figure 10:
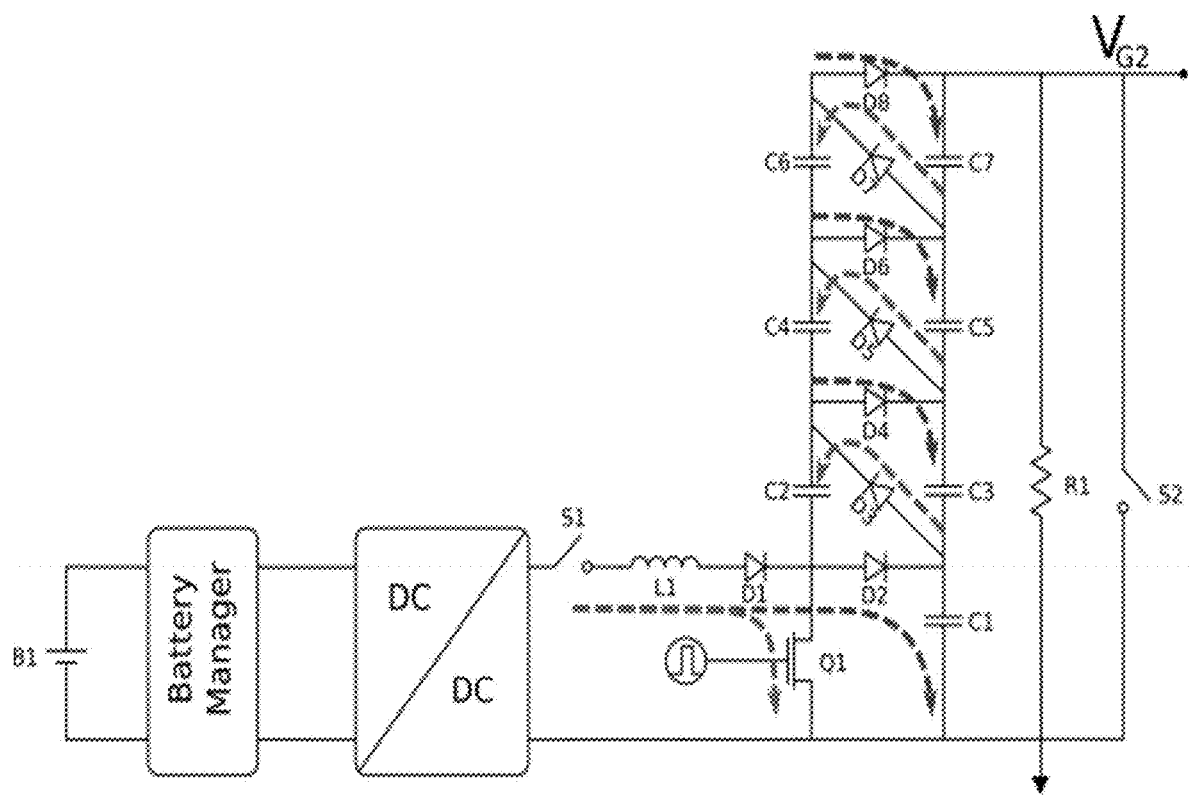
FIG. 10 shows another circuit configuration for providing a voltage to the particular grid of the sensor.

In another method or configuration for generating the voltage sweep the principles of boost conversion and/or charge pumping can be applied. A hybrid solution is provided but it should be clear that variations of the current technique can be applied. FIG. 10 illustrates the circuit used to generate the high voltage sweep using this technique. The battery delivers a 3V output to the input of a low profile DC-DC converter to increase the voltage to approximately 80V. The 80V signal is coupled through a series boost inductor and diode (boost circuit) to a voltage multiplier circuit. A field-effect transistor (FET) controlled by a pulse width modulated (PWM) signal is coupled to the system floating ground after the series diode to modulate the 80 V supply and drive the voltage multiplier circuit. At the input to the voltage multiplier circuit the voltage has been boosted to approximately 250V by the boost circuit, but may be higher as required by the application. In this example the voltage multiplier has four stages but can have many more stages to deliver higher and higher voltages. Each voltage multiplier stage has the typical design where each stage increases the voltage applied to the input. The first capacitor C1 will charge to a maximum level of 500V after a sufficient number of cycles of the PWM signal has taken place. Similarly the output of C3 will reach 1000 V, C5 will reach 1500V and C7 will reach 2000V. At each stage a series of diodes are configured to prevent the charge storage capacitors from discharging during the PWM off state thus providing the "multiplying" effect desired to generate the high voltage sweep. The ion current is sampled at regular voltage intervals in the high voltage sweep using the ADC to build up the current voltage characteristic.

A more detailed explanation of how exactly the high voltage generating circuit of FIG. 10 operates is provided hereinafter.

Regardless of the mechanism used to generate the high voltage sweep the ion current may be sampled while the voltage sweep applied to $G_2$ is ascending and/or descending. If the sweep is a staircase function, the current is sampled at each voltage step. If the sweep is continuous, the current is sampled continuously such that a number of samples (N), a sum of current values, a sum of current squared values, a sum of voltage values and a sum of voltage squared values are recorded such that the average and slope of all points in a chosen bin can be recovered.

Ion current flowing into the analyser, when the imitation wafer probe is in idle mode, can lead to undesirable charging of $G_2$. A switch between the high voltage output to $G_2$ and the floating ground is used to discharge $G_2$ immediately before the voltage sweeping process is initiated. The collector is biased negatively with respect to $G_0$ to create an attractive force for incoming ions to ensure they reach the collector for detection. The collector current flows through the measurement circuit where it is sampled and digitised as a function of the voltage applied to $G_2$ using the high speed ADC.

$G_3$ is biased negatively with respect to the collector as illustrated in FIG. 6 to repel back to the collector any secondary electrons emitted from the collector surface due to ion impact. Otherwise, an escaping electron would be perceived as an extra ion detected in the measurement circuit thus distorting the measurement of the IED. The IED, or as mentioned earlier the ion current versus energy distribution, is expressed by the following equation $$f(v) = \frac{M_i}{e^2} \cdot \frac{1}{T_{eff} \cdot A} \cdot \frac{dI_C}{dV_{G2}} \qquad (2)$$

where f(v) is the ion velocity distribution, $M_i$ is the ion mass, $T_{eff}$ is the effective transmission of the grid stack, A is the area of the sampling apertures, Ic is the collector current and $V_{G2}$ is the ion energy discriminating voltage applied to $G_2$. When plotted the discriminator voltage is easily converted to ion energy by multiplying by the electronic charge $eV_{G2}$. However, the ion current remains a function of ion velocity. Hence, it is not a true ion energy distribution but rather an ion current versus energy distribution. Nonetheless, the measured distribution is more important for plasma processing since the two key parameters that drive processes are ion current (also called ion flux) and the ion impact energy at the surface. It should be noted that the ion energy referred to is the energy perpendicular to the substrate surface.

Figure 5B:
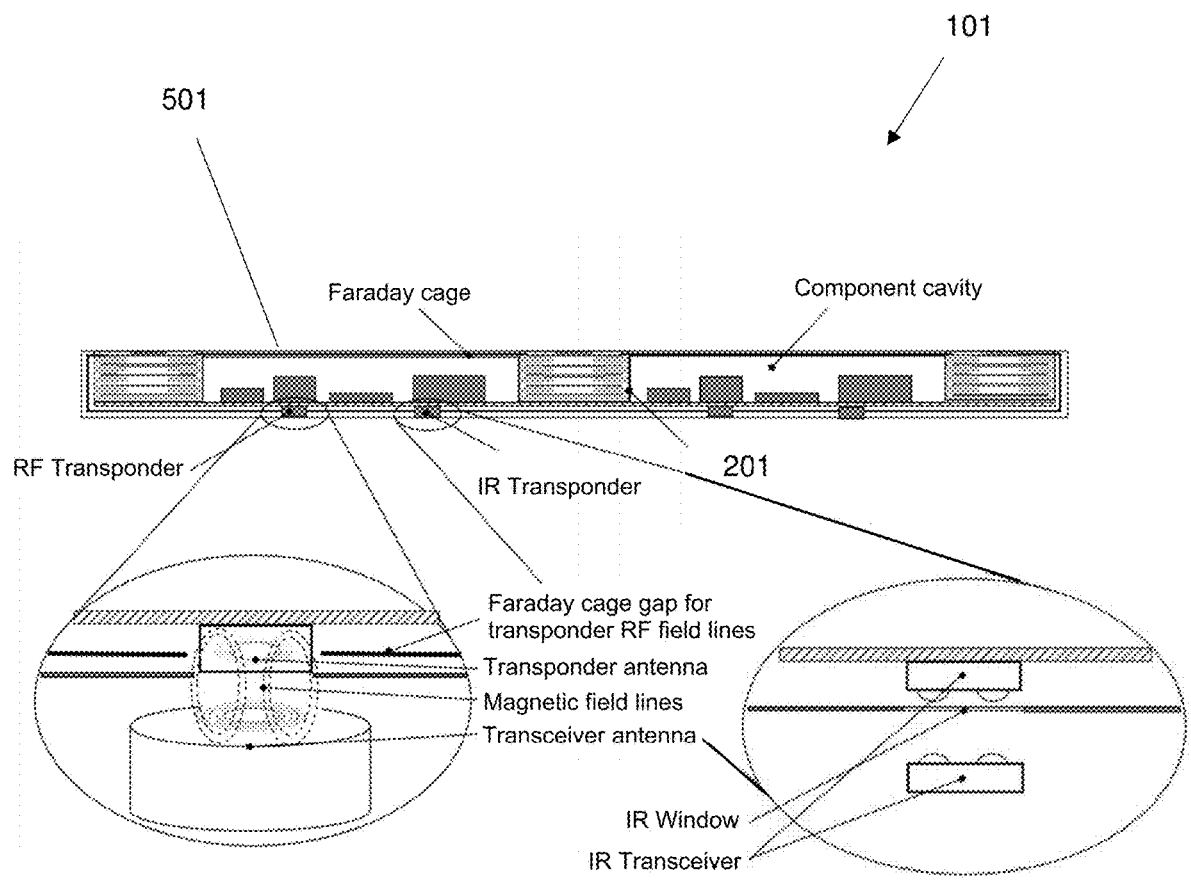
FIG. 5(b) also shows a cross section of a wafer probe in accordance with the present teaching.

As previously mentioned with respect to FIG. 1, once the imitation wafer probe 101 is transferred to the processing pedestal and the chamber pressure criterion is met the IED scans proceed as scheduled. Each IED measurement is stored in the flash memory module of the microcontroller. Once the experimental assignment is complete the robot arm transfers the IWP from the processing pedestal to a FOUP where it can be removed by the user. It is then placed in the docking station for data retrieval. The transponder(s) on the wafer probe communicate wirelessly to the docking station using RF or IR technology. There may be one centralized wafer probe transponder that communicates data from all sensors or there may be localised wafer probe transponders for communicating each sensor data individually. The transponder(s) are located close to the backplane of the IWP. A small gap is made in the faraday shield of the imitation wafer probe 101 for each transponder, to allow the wireless signal through for detection by a transceiver in the docking station aligned therewith the wafer probe transponder(s). This configuration can be seen in FIGS. 5(a) and 5(b). In particular, FIG. 5(a) shows the use of RF communication only while FIG. 5(b) shows the wafer probe 101 configured for both RF and IR communication. Of course, the wafer probe 101 could be configured for only IR communication. In practice, it has been found that IR communication is much fast than RF communication.

The transponder-transceiver pair(s) serve the dual purpose of providing the wireless charging pathway for the wafer probe battery. The form factor of the docking station may be designed to closely resemble any standard wafer or substrate carrier for ease of transport to and from cleanroom environments. The docking station transceiver(s) is controlled through a microcontroller which in turn is controlled through a computer embedded in the docking station. Data retrieved from the wafer probe 101 is stored in a database in the computer and is made accessible by the user through an Ethernet connection for convenience. A web browser is used to interact with the docking station computer to configure and charge the sensor and to export data from the database. The application displays the temporal ion current versus energy profiles for single point wafer probes and the spatiotemporal ion current versus energy profiles for multi point wafer probes to identify process drift over time and/or spatial uniformity issues across the wafer surface for each experimental assignment. Several API's are also available to communicate to the docking station using numerous industry protocols such as SECS/GEM protocol often used in the semiconductor industry.

As previously mentioned, the ion energy analyser 201 requires an appropriate high voltage sweep signal to be applied to $G_2$ to make it function properly. To work in the complex environment within a plasma processing chamber the high voltage circuit and the physical sensor must be encased together in a Faraday shield to protect from electromagnetic interference as shown in FIG. 5(a). The plasma, once ignited, provides a source of ion current to the wafer probe surface. This can charge the grid surfaces within the ion energy analyser(s) when the wafer probe 101 is in idle mode. Thus, the output of the high voltage sweep generator circuit must incorporate a high voltage switch to discharge $G_2$ to the wafer floating ground prior to each ion energy scan being carried out.

The wafer probe may be a silicon wafer design with strict requirements on the wafer thickness to be less than 3 or 4 mm in height to fit through the transfer chamber window to the main processing chamber. The wafer probe may be also be manufactured on some alternative substrate base which does not have these height restrictions for other applications. As a result, the high voltage sweep generator may be configured in two different ways depending on the height restrictions, sweep voltage profile required and power consumption limitations.

FIGS. 9 and 10 show variations of the circuit used to produce a high voltage dc sweep generator from a low voltage dc source, which in the exemplary embodiment may be a low profile solid state battery with dc voltage output in the range of 2.75 to 4.5V. To protect the battery from overcharging and over-discharging a battery manager is used. It is configured to disconnect the battery when the voltage depletes below a certain threshold. This in turn disconnects power to the main circuit. Power to the main circuit will not be restored until the battery voltage has recharged above the threshold level. The battery manager also draws the charge power from the RF antenna that forms part of the receiver in the docking station.

The battery manager circuit also regulates the battery output voltage to a fixed voltage level which in this exemplary embodiment is 3.2 V. The high voltage generating circuit shown in FIG. 9 includes of a low voltage to high voltage transformer (T1) (first stage) feeding a voltage multiplier (second stage). The voltage multiplier is a type of Cockcroft-Walton voltage multiplier circuit consisting of capacitor components C1, C2, C3 and C4 in combination with diode components D1, D2, D3 and D4. A Low voltage AC signal is generated on the primary side of T1 using a H-bridge switch. The H-bridge, or any similar switching topology, is used to allow bipolar current flow through the primary winding of T1 from the single rail power supply. The AC signal frequency and amplitude is controlled by the microcontroller. The 1:N turns ratio transformer T1 produces a high voltage AC signal on secondary side. During the positive half-cycle, C2 is charged via C1 and D2 and C4 is charged via C1, C3 and D4. During the negative half-cycle C1 is charged via D1 and C3 is charged via C2 and D3. After a pre-determined number of AC cycles, the voltage across all capacitors equalise, and $VG_2$ reaches the maximum level of four times the voltage across C2. It is evident that $VG_2$ can be gradually increased from zero to the maximum by controlling the frequency and amplitude of the AC signal applied to the primary winding of T1. Thus, the typical increasing voltage ramp (saw-tooth or staircase function) used to drive the ion energy discrimination in retarding field analysers can be achieved. Once the maximum voltage in the voltage sweep has been reached, and the resultant ion current has been measured, the AC voltage applied to the primary winding of T1 is turned off in order to reset $VG_2$ to zero in preparation for the next voltage sweep. The switch S1 is also closed at this point to help discharge $G_2$ and the capacitors quickly.

While the circuit illustrated in FIG. 9 generates a voltage sweep profile similar to that commonly used in wired retarding field analyser designs, it may not be suitable for all types of imitation substrate probe. The limiting factor is the height profile of the transformer. Off the shelf transformers that meet the requirements do not exist with sufficiently low profile to fit the imitation silicon wafer probe for example, which has a maximum overall height restriction of 3 to 4 mm, and desired height of <1 mm. While such a transformer can be designed, it may be cost prohibitive.

An alternative solution was devised to meet the height requirements as illustrated in FIG. 10.

The battery and battery manager components are the same as in FIG. 9. The battery manager feeds an off the shelf, low profile, DC-DC converter with integrated voltage doubler to step up the DC voltage level to 80 V. The high voltage generating circuit comprises of a boost section followed by a voltage multiplier section. The boost section is a typical DC-DC boost converter topology using an inductor L1, MOSFET transistor Q1 (switched on and off with a pulse width modulator), diode D2 and capacitor C1. This allows the circuit charge C1 to voltages greater than 80V, the DC-DC output voltage in the exemplary embodiment therein. The multiplier section is very similar to the Cockcroft-Walton type voltage multiplier circuit of FIG. 9 with capacitor components C2, C3, C4, C5, C6, and C7 and diode components D3, D4, D5, D6, D7 and D8. The circuit of FIG. 10 generates the voltage sweep in a different way compared to the circuit of FIG. 9. Instead of a voltage sweep which starts at zero and gradually increases to the maximum, this circuit is used to quickly ramp the voltage to the maximum level and then slowly sweep it back to zero. However, it could also be used to sweep the voltage gradually from zero to maximum voltage.

The skilled person should appreciate that the present teachings are not limited to a MOSFET transistor. Rather any suitable transistor may be chosen e.g., bipolar transistor.

For the ion energy analyser 201 operation it does not matter if the voltage sweep applied to grid $G_2$ ramps up from zero to maximum or ramps down from maximum to zero. However, this method of generating the voltage sweep using rapid ramp up and slow discharge (descending voltage sweep) consumes significantly less power than the continuous mode of FIG. 9, which gradually increases the voltage from zero to maximum. It should be noted that the circuit of FIG. 9 can be operated in the discontinuous mode described for FIG. 10, where the voltage can also be rapidly increased to the maximum before slowly discharging back to zero. As is evident to the person skilled in the art, this would require the addition of a discharge resistor, R1, as described in more detail with respect to FIGS. 8(b) and 10.

Because the circuit illustrate in FIG. 10 operates discontinuously, D1 is added to prevent current flowing back to floating ground via L1, from C2, after the energy stored in L1 has depleted.

A switch S1 is used to connect the boost circuit to the 80V output of the DC-DC converter. S1 remains closed while the $VG_2$ is charging to the maximum level. The switching rate of the MOSFET transistor Q1 is controlled microprocessor output. When Q1 is open, C1 is charged from the DC-DC converter 80 V output and the energised inductor, via D1 and D2. Then C3 is charged by C2 via D4, C5 is charged by C4 via D6 and C7 is charged by C6 via D8. When Q1 is closed, L1 is energised by current flowing from the DC-DC converter to floating ground via Q1. The voltages across capacitors C2, C4 and C6 relative to floating ground decrease due to Q1 being closed and drop below the voltages across capacitors C1, C3 and C5 respectively. Now, C2 is charged by C1 via D3, C4 is charged by C3 via D5 and C6 is charged by C5 via D7. With the boost segment operating in discontinuous mode, the energy (E) stored in L1 is given by $$E = \frac{(V \times T_{ON})^3}{2 \times L},$$

V is the voltage across L1, TON is the length of time the transistor switch is closed and L is the inductance of L1. After a number of Q1 switch cycles, the voltages across all capacitors equalise to give the maximum $VG_2$ required. In this example $VG_2$ will be approximately four times the voltage across C1. More stages can be added to increase $VG_2$ as required. Once the maximum $VG_2$ has been reached, switch S2 is closed to initiate the discharge of $VG_2$ and slowly decrease it to zero volts. Resistor R1 is placed in parallel with S2. The combination of R1 and the capacitors set the $VG_2$ discharge sweep rate.

The voltage multiplier (stage 2 of the high voltage generating circuit) of FIG. 10 has 2 parallel strings of capacitors, (C1, C3, C5 and C7) and (C2, C4 and C6). When the transistor switch Q1 is open, the input to the multiplier is high, and it charges C1, C2 charges C3, C4 charges C5, and C6 charges C7. When Q1 is closed, input is low and C1 charges C2, C3 charges C4, and C5 charges C6. The switch Q1 is toggled on and off repeatedly so that all capacitors have a charge voltage equivalent to the input voltage. As a result, the output $VG_2$ is 4 times the input voltage. Using the voltage multiplier directly from the 80V line would give a maximum voltage of about 300V, when efficiency is taken into account.

To increase that voltage further, the voltage multiplier is preceded by a boost circuit. Energy is stored in an inductor L1 and transferred to a capacitor C1, where diode D1 prevents the energy going back to the input via the inductor. The input to the boost circuit is 80V, when the transistor is on, the inductor is short to ground, increasing the inductor current and storing energy. When the transistor is off, current will continue to flow through the inductor to capacitor C7 via D8 and D1. The voltage across capacitor C7 will increase as its stored energy increases. The input voltage is 80V, the MOSFET transistor shorts both the inductor and voltage multiplier input to ground. The transistor is released after a few microseconds, which induces the current needed to achieve the charge pumping effect to generate the maximum voltage $VG_2$.

It will be appreciated by the person skilled in the art that the voltage values provided with respect to the exemplary embodiments of FIGS. 8(a), 8(b), 9 and 10 are merely exemplary. The present teachings should not be considered to be restricted to these values. Rather, these circuits can be configured as appropriate to provide the desired voltages.

Figure 11:
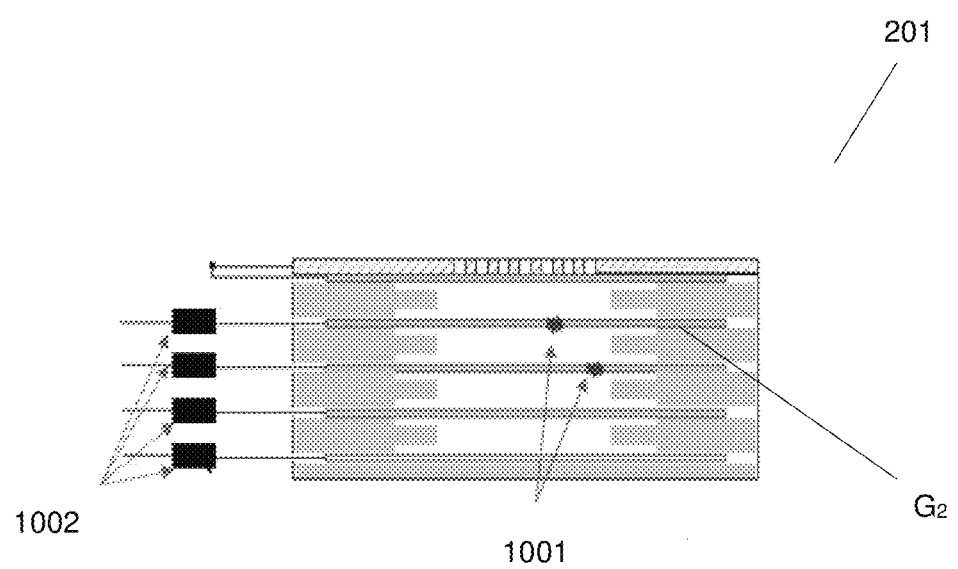
FIG. 11 shows the use of quench resistors in accordance with the present teachings.

Another advantageous feature of the present teachings is shown with respect to FIG. 11. This figure shows a schematic of a brief arc 1001 or plasma formation between the grids of the ion energy analyser 201. In practices, this has been found to most likely to happen between $G_2$ and one of the grids at either side. However, it can happen between any two grids. These phenomena can happen for several reasons. The Paschen law dictates that the high voltage on $G_2$ should not cause electrical breakdown between the grids with the spacing used at the pressure range of interest, under ideal conditions. However, microscopic particles can enter from the plasma or sputter from a grid surface and can initiate a sudden arc 1001 or brief plasma strike.

If breakdown does occur, $G_2$ could suddenly discharge to one of the other grids. It is also possible that this sudden discharge could be sustained for longer by drawing unlimited current from the battery. If a discharge occurs the $G_2$ voltage (and energy accumulated) is immediately discharged, rendering the scan useless.

To address the issue of arc formations between the grids, a, set of current limiting resistors 1002 are added in series with the grids to immediately quench a breakdown event if one were to occur. The resistors are placed between the grids and the energy supply to the respective grids. In doing so it will also prevent the sudden discharge of $G_2$ voltage supply to prevent the loss of scan data.

It should be appreciated that the full set of resistors as shown in FIG. 11 do not need to be provided. For example, only a single resistor could be provided between any of the conductive grids and the corresponding power supply. Since it has been found that most plasma formation occurs with respect to grid $G_2$ then a resistor may be provided to only this grid.

This feature is not limited to use with the high voltage generation circuits of either FIG. 8(a), 8(b), 9 or 10. This feature can also be used with known sensors with integrated power sources described with respect to the prior art above.

While we discuss the IED measurement throughout this document, it is clear that by swapping the polarity of the grid potentials, the electron energy distribution can also be measured.

The invention is not limited to the embodiment(s) described herein but can be amended or modified without departing from the scope of the present invention.

The invention claimed is:

1. An apparatus for obtaining ion energy distribution, IED, measurements in a plasma processing system comprising:
   a substrate for placement in the plasma processing system and exposed to the plasma;
   an ion energy analyser disposed in the substrate for measuring the ion energy distribution at the substrate surface during plasma processing, the analyser comprising a first conductive grid, G0, a second conductive grid, G1, a third conductive grid, G2, a fourth conductive grid G3, and a collection electrode, C, each grid separated by an insulating layer;
   a battery power supply and a battery manager integrated in the substrate, for supplying and controlling voltage to each of the grids and the collection electrode of the ion energy analyser; and
   a high voltage generating circuit within the substrate, the high voltage generating circuit comprising a low voltage to high voltage transformer feeding a voltage multiplier, wherein the high voltage generating circuit takes the output voltage of the battery manager and supplies a voltage sweep to the third conductive grid.

2. The apparatus for obtaining IED measurements of claim 1 wherein the voltage sweep applied to the third conductive grid is ascending.

3. The apparatus for obtaining IED measurements of claim 2 wherein the apparatus is configured to sample ion current while the voltage sweep is ascending.

4. The apparatus for obtaining IED measurements of claim 1 wherein the voltage sweep applied to the third conductive grid is descending.

5. The apparatus for obtaining IED measurements of claim 4 wherein the apparatus is configured to sample ion current while the voltage sweep is descending.

6. The apparatus for obtaining IED measurements of claim 1 wherein the battery manager is configured to regulate the output voltage of the battery manager to a fixed voltage level.

7. The apparatus for obtaining IED measurements of claim 1 wherein the voltage multiplier is a Cockcroft-Walton based voltage multiplier.

8. The apparatus for obtaining IED measurements of claim 7 further comprising a microcontroller within the substrate, the high voltage generating circuit further comprising an H-bridge to generate a low voltage AC signal for input to the primary side of the transformer, wherein the AC signal frequency and amplitude are controlled by the microcontroller.

9. The apparatus for obtaining IED measurements of claim 8 wherein the high voltage generating circuit is configured so that controlling the frequency and amplitude of the AC signal applied to the primary winding of the transformer determines the voltages of the voltage sweep applied to the third conductive grid.

10. The apparatus for obtaining IED measurements of claim 1 wherein the high voltage generating circuit further comprises a high voltage switch for discharging the third conductive grid to a floating ground of the apparatus.

11. The apparatus for obtaining IED measurements of claim 10 wherein the high voltage generating circuit further comprises a resistor in parallel with the high voltage switch.

12. The apparatus for obtaining IED measurements of claim 11 wherein the resistor determines the discharge time of the voltage discharged from the third conductive grid to the floating ground.

13. The apparatus for obtaining IED measurements of claim 1 further configured so that the voltage sweep applied to the third conductive grid is continuous.

14. The apparatus for obtaining IED measurements of claim 1 further configured so that the voltage sweep applied to the third conductive grid is a staircase function.

15. The apparatus for obtaining IED measurements of claim 1 further comprising a resistor in series between at least one of the grids and the high voltage generating circuit.

16. An apparatus for obtaining ion energy distribution, IED, measurements in a plasma processing system comprising:
   a substrate for placement in the plasma processing system and exposed to the plasma;
   an ion energy analyser disposed in the substrate for measuring the ion energy distribution at the substrate surface during plasma processing, the analyser comprising a first conductive grid, G0, a second conductive grid, G1, a third conductive grid, G2, a fourth conductive grid G3, and a collection electrode, C, each grid separated by an insulating layer;
   a battery power supply and a battery manager integrated in the substrate, for supplying and controlling voltage to each of the grids and the collection electrode of the ion energy analyser; and
   a high voltage generating circuit within the substrate, the high voltage generating circuit comprising a DC-DC converter and a boost section followed by a voltage multiplier section, wherein the high voltage generating circuit takes the output voltage of the battery manager and supplies a voltage sweep to the third conductive grid.

17. The apparatus for obtaining IED measurements of claim 16 wherein the voltage sweep applied to the third conductive grid is ascending.

18. The apparatus for obtaining IED measurements of claim 17 wherein the apparatus is configured to sample ion current while the voltage sweep is ascending.

19. The apparatus for obtaining IED measurements of claim 18 wherein the voltage sweep applied to the third conductive grid is descending.

20. The apparatus for obtaining IED measurements of claim 19 wherein the apparatus is configured to sample ion current while the voltage sweep is descending.

21. The apparatus for obtaining IED measurements of claim 16 wherein the battery manager is configured to regulate the output voltage of the battery manager to a fixed voltage level.

22. The apparatus for obtaining IED measurements of claim 16 wherein the voltage multiplier section is a Cockcroft-Walton based voltage multiplier.

23. The apparatus for obtaining IED measurements of claim 16 wherein the boost section comprises an inductor, L1, a transistor, Q1, a diode, D2, and a capacitor, C1, the boost section is configured to boost the voltage output of the DC-DC converter.

24. The apparatus for obtaining IED measurements of claim 23 further comprising a microprocessor within the substrate, wherein the transistor is controlled by a pulse width modulated signal from the microprocessor.

25. The apparatus for obtaining IED measurements of claim 16 wherein the high voltage generating circuit further comprises a high voltage switch for discharging the third conductive grid to a floating ground of the apparatus.

26. The apparatus for obtaining IED measurements of claim 25 wherein the high voltage generating circuit further comprises a resistor in parallel with the high voltage switch.

27. The apparatus for obtaining IED measurements of claim 26 wherein the resistor determines the discharge time of the voltage discharged from the third conductive grid to the floating ground.

28. The apparatus for obtaining IED measurements of claim 16 further configured so that the voltage sweep applied to the third conductive grid is continuous.

29. The apparatus for obtaining IED measurements of claim 16 further configured so that the voltage sweep applied to the third conductive grid is a staircase function.

30. The apparatus for obtaining IED measurements of claim 16 further comprising a resistor in series between at least one of the grids and the high voltage generating circuit.

* * * * *